United States Patent
Lin

(10) Patent No.: US 9,508,698 B2
(45) Date of Patent: Nov. 29, 2016

(54) LIGHT EMITTING DEVICE

(71) Applicants: LITE-ON OPTO TECHNOLOGY (CHANGZHOU) CO., LTD., Jiangsu Province (CN); LITE-ON TECHNOLOGY CORP., Taipei (TW)

(72) Inventor: Chen-Hsiu Lin, Taipei (TW)

(73) Assignees: Lite-On Opto Technology (ChangZhou) Co. Ltd., Jiangsu Province (CN); Lite-On Technology Corp., Taipei (TW)

(*) Notice: Subject to any disclaimer, the term of this patent is extended or adjusted under 35 U.S.C. 154(b) by 0 days.

(21) Appl. No.: 14/715,895

(22) Filed: May 19, 2015

(65) Prior Publication Data

US 2016/0071830 A1    Mar. 10, 2016

(30) Foreign Application Priority Data

Sep. 5, 2014   (CN) .......................... 2014 1 0454059

(51) Int. Cl.

| | | |
|---|---|---|
| *H01L 25/16* | (2006.01) | |
| *H01L 33/48* | (2010.01) | |
| *H01L 33/52* | (2010.01) | |
| *H01L 33/62* | (2010.01) | |
| *H01L 25/075* | (2006.01) | |
| *H01L 29/866* | (2006.01) | |
| *F21K 99/00* | (2016.01) | |

(52) U.S. Cl.
CPC ......... *H01L 25/167* (2013.01); *H01L 25/0753* (2013.01); *H01L 25/165* (2013.01); *H01L 29/866* (2013.01); *F21K 9/00* (2013.01); *H01L 33/62* (2013.01); *H01L 2224/48137* (2013.01)

(58) Field of Classification Search
CPC ....... H01L 25/16; H01L 33/48; H01L 33/52; H01L 33/62; H01L 25/075; H01L 29/866
USPC .................................. 257/88, 89, 91, 98, 99
See application file for complete search history.

(56) References Cited

U.S. PATENT DOCUMENTS

| | | | |
|---|---|---|---|
| 7,202,506 B1 * | 4/2007 | DenBaars et al. .............. | 257/90 |
| 2011/0193112 A1 * | 8/2011 | Inoue et al. .................... | 257/91 |
| 2011/0254022 A1 * | 10/2011 | Sasano ............................ | 257/88 |
| 2013/0105835 A1 * | 5/2013 | Wu et al. ........................ | 257/89 |

* cited by examiner

*Primary Examiner* — Sheng Zhu

(74) *Attorney, Agent, or Firm* — Rosenberg, Klein & Lee

(57) ABSTRACT

A light emitting device includes a substrate having a top surface, upper and lower metal layers, multiple LED chips, at least one Zener diode, multiple conductive wires and an encapsulant. The top surface includes a central region bounded by an imaginary boundary with a profile conforming to an outline of a circle stacked with a polygon. The central region has a die bonding area corresponding to the circle, and at least one polygonal extension area formed outside the die bonding area. The upper metal layer includes multiple conducting pads surrounding the central region. The LED chips are disposed on the die bonding area. The Zener diode is disposed on the polygonal extension area. The encapsulant is disposed on the substrate and covers the LED chips.

20 Claims, 19 Drawing Sheets

LIGHT EMITTING DEVICE

CROSS-REFERENCE TO RELATED APPLICATION

This application claims priority of Chinese Patent Application No. 201410454059.8, filed on Sep. 5, 2014.

FIELD OF THE INVENTION

This invention relates to a light emitting device, more particularly to a light emitting device including a plurality of LED chips and at least one Zener diode.

BACKGROUND OF THE INVENTION

With technological development, LED devices having smaller dimensions, lighter weight and higher output wattage have become mainstream technology. A conventional light emitting device includes an aluminum oxide substrate formed with silver wirings thereon by thin film deposition. However, sulfurization of the silver wirings at a die bonding area of the aluminum oxide substrate often leads to luminous decay. In addition, much research has been targeted at enhancement of light efficiency and cost reduction (e.g., by reducing the amount of phosphor powder used in manufacturing the light emitting device).

SUMMARY OF THE INVENTION

An object of the present invention is to provide a light emitting device that has superior light extraction efficiency and that is cost-effective.

With deposition of a Zener diode on a polygonal extension area of a central region, the Zener diode would not block the light emitted from LED chips of a light-emitting device, thereby enhancing the light extraction efficiency of the light emitting device. In addition, reduction in the area of an upper metal layer of the light-emitting device would increase the bonding area between an encapsulant and a top surface of a substrate of the light-emitting device, thereby increasing the bonding strength between the encapsulant and the substrate. Moreover, with a receiving space defined by a surrounding wall and the top surface of the substrate that surrounds a substantially circular die bonding area of the central region, a luminescent layer could be received in the receiving space by a glue dispensing technique, and less use of phosphor powder for the luminescent layer is achieved, thereby reducing manufacturing costs. Furthermore, the substrate made of a mixture of aluminum oxide and a desired inorganic component has superior light reflectivity. Therefore, light irradiated to the substrate from the LED chips would be reflected more effectively, thereby enhancing the light extraction efficiency of the light emitting device. Besides, formation of the upper metal layer and a lower metal layer by the screen printing technique would also reduce manufacturing costs.

BRIEF DESCRIPTION OF THE DRAWINGS

Other features and advantages of the present invention will become apparent in the following detailed description of the embodiments with reference to the accompanying drawings, of which.

DETAILED DESCRIPTION OF THE EXEMPLARY EMBODIMENTS

Figure 1:
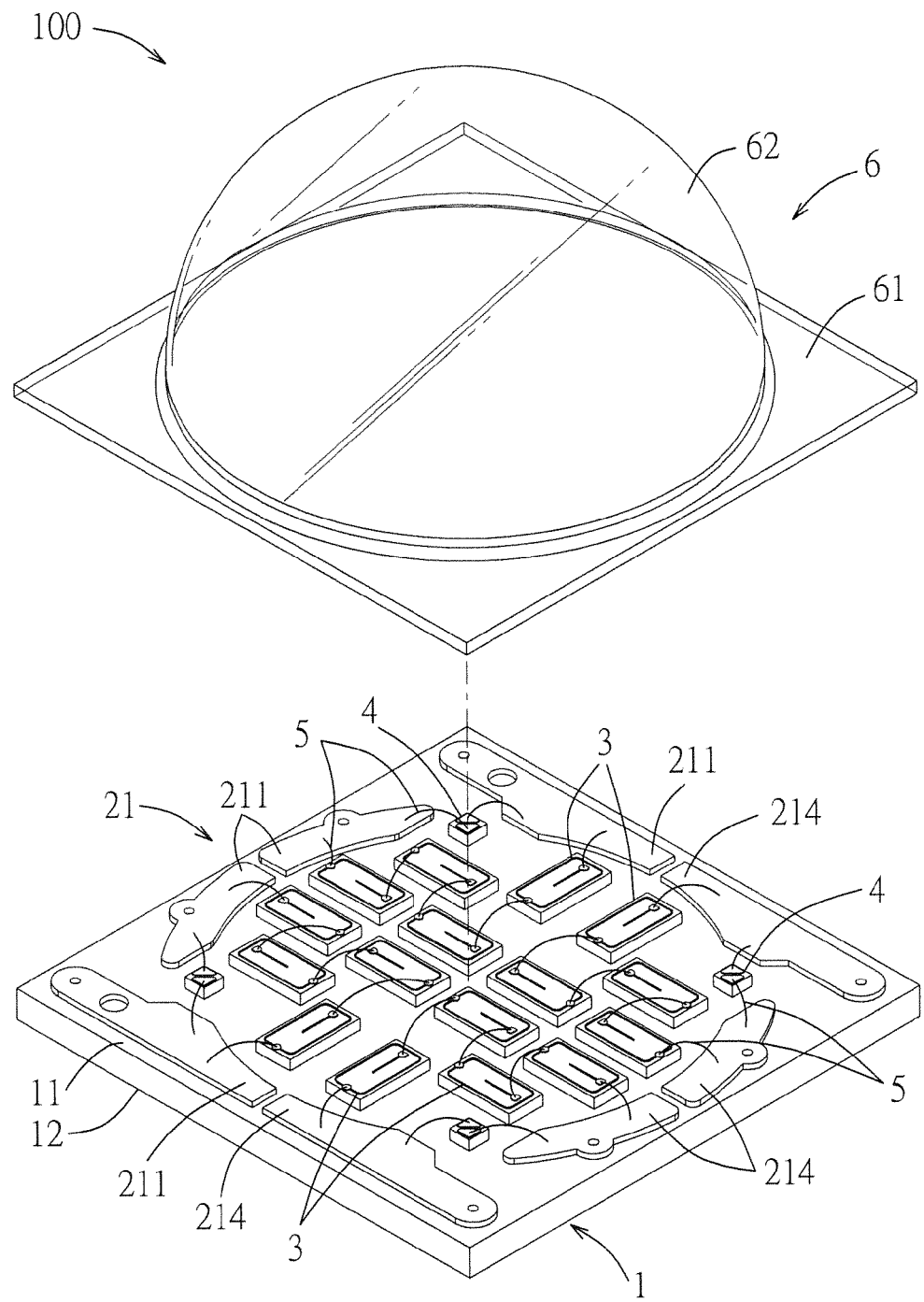
FIG. 1 is an exploded perspective view of a first embodiment of a light emitting device according to the present invention.

Before the present invention is described in greater detail with reference to the accompanying embodiments, it should be noted herein that like elements are denoted by the same reference numerals throughout the disclosure.

First Embodiment

Figure 2:
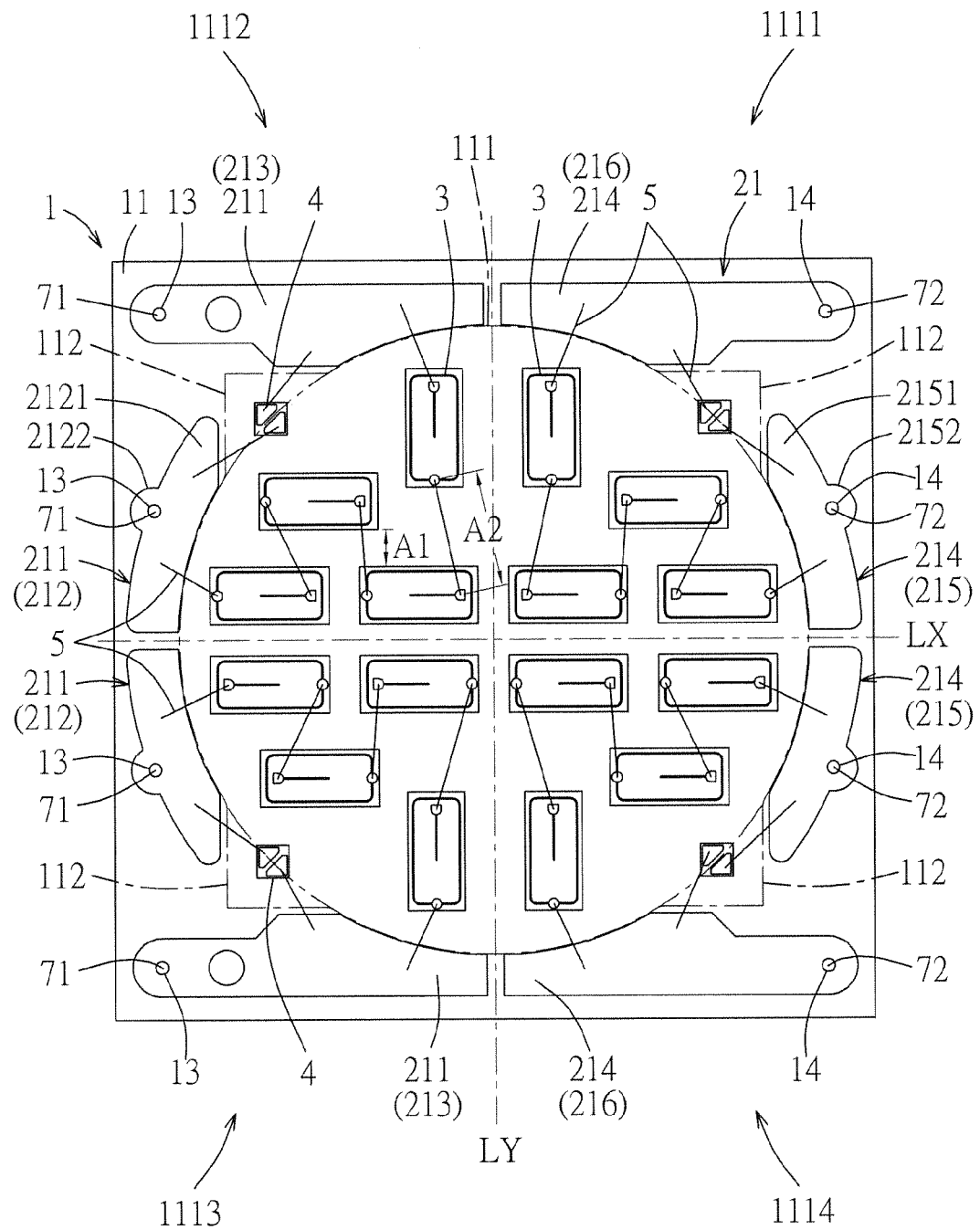
FIG. 2 is a top view of the first embodiment without an encapsulant covering on a substrate.
Figure 3:
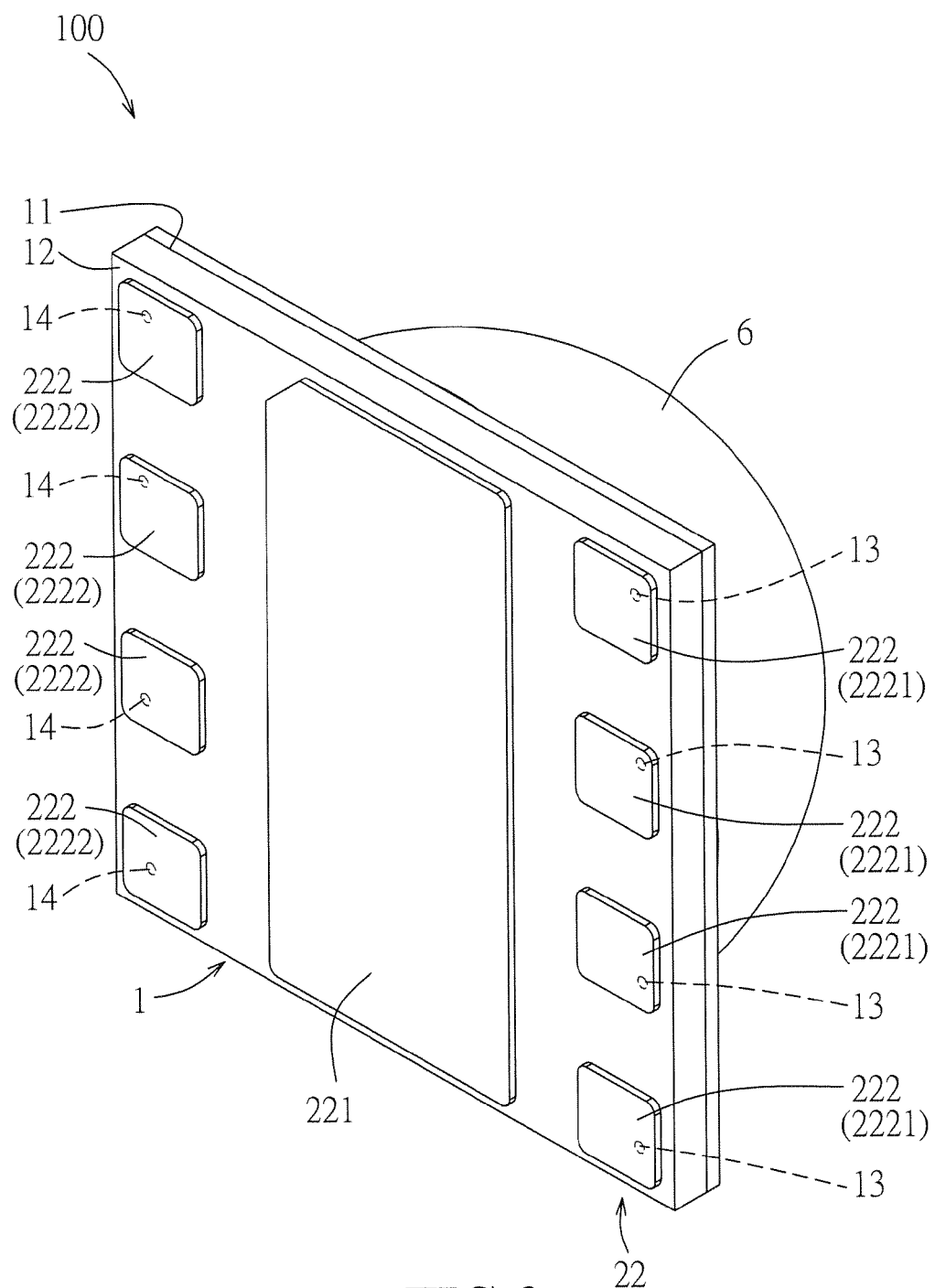
FIG. 3 is a perspective view showing a lower metal layer included in the first embodiment.

Referring to FIGS. 1, 2 and 3, a first embodiment of a light emitting device 100 according to the present invention includes a substrate 1, an upper metal layer 21, a lower metal layer 22, a plurality of LED chips 3, a plurality of Zener diodes 4, a plurality of conductive wires 5 and an encapsulant 6.

The substrate 1 is square shaped and has a top surface 11, a bottom surface 12 opposite to the top surface 11, a plurality of first and second via holes 13, 14 interconnecting the top and bottom surfaces 11, 12, and a plurality of first and second inner conductors 71, 72. The top surface 11 includes a central region that is bounded by an imaginary boundary with a profile substantially conforming to an outline of a circle in combination with a polygon stacked on the circle. The central region has a substantially circular die bonding area 111 that corresponds to the circle, and at least one polygonal extension area 112 that is formed outside the die bonding area 111 by an intersection of the circle with a corner part of the polygon. In the first embodiment, the polygon of the outline is a rectangle. Therefore, the central region has the substantially circular die bonding area 111 and four polygonal extension areas 112 each having a substantially triangular shape. In the first embodiment, the substrate 1 includes four first via holes 13, four second via holes 14, four first inner conductors 71 and four second inner conductors 72. Each of the first inner conductors 71 is disposed in a respective one of the first via holes 13. Each of the second inner conductors 72 is disposed in a respective one of the second via holes 14.

The substrate 1 is made of a mixture of aluminum oxide ($Al_2O_3$) and a desired inorganic component selected from the group consisting of zirconium (Zr), calcium (Ca), barium (Ba), magnesium (Mg), oxides thereof, aluminates thereof, and aluminosilicates thereof. For example, the inorganic component may be Zr, $ZrO_2$, $BaAl_2Si_2O_8$, $CaAl_2SiO_2O_8$ or $MgAl_2O_4$. The substrate 1 may have a coefficient of thermal conductivity ranging from 15 to 24 W/m·K. Compared with pure $Al_2O_3$ substrates, the substrate 1 has superior light reflectivity attributed to the aforesaid particular material of which the substrate 1 is made. Therefore, light emitted from the LED chips 3 could be effectively reflected from the substrate 1 toward the surrounding environment, thereby enhancing the light extraction efficiency of the light emitting device 100.

The upper metal layer 21 includes a conducting pad assembly containing at least one first conducting pad 211 and at least one second conducting pad 214. The first and second conducting pads 211, 214 are disposed on the top surface 11 of the substrate 1 and surround the central region. Each of the at least one first conducting pad 211 and the at least one second conducting pad 214 is arc shaped and is disposed along the circle, or is linear shaped and is disposed along the rectangle. In the first embodiment, the conducting pad assembly of the upper metal layer 21 includes four first conducting pads 211 and four second conducting pads 214. Two of the first conducting pads 211 are arc shaped pads 212 and the other two of the first conducting pads 211 are linear shaped pads 213. Two of the second conducting pads 214 are arc shaped pads 215 and the other two of the second conducting pads 214 are linear shaped pads 216. The two arc shaped pads 212 of the first conducting pads 211 are disposed oppositely of the two arc shaped pads 215 of the second conducting pads 214 and surround the substantially circular die bonding area 111 in combination with the two arc shaped pads 215 of the second conducting pads 214. The two linear shaped pads 213 of the first conducting pads 211 and the two linear shaped pads 216 of the second conducting pads 214 are correspondingly disposed along two opposite sides of the polygon. Each of the arc shaped pads 212, 215 of the first and second conducting pads 211, 214 has a main portion 2121, 2151 and a protruded portion 2122, 2152 protruding from the main portion 2121, 2151 oppositely of the central region. The main portion 2121, 2151 of each of the arc shaped pads 212, 215 is an arc-shaped strip aligned along the substantially circular die bonding area 111. The protruded portion 2122, 2152 of each of the arc shaped pads 212, 215 has a substantially semi-circular shape. The relation between the shapes of the first and second conducting pads 211, 214 and the encapsulant 6 will be described in detail hereinafter.

The lower metal layer 22 includes a soldering pad assembly 222 that includes at least one first soldering pad 2221 and at least one second soldering pad 2222. The first and second soldering pads 2221, 2222 are disposed on the bottom surface 12 of the substrate 1 and are electrically connected to the first and second conducting pads 211, 214, respectively. To be more specific, the first conducting pad 211 is electrically connected to the first soldering pad 2221 via the first inner conductor 71. The second conducting pad 214 is electrically connected to the second soldering pad 2222 via the second inner conductor 72.

Referring to FIG. 3, in this embodiment, the lower metal layer 22 includes a heat dissipation pad 221, four first soldering pads 2221 and four second soldering pads 2222. The heat dissipation pad 221 substantially aligns with the substantially circular die bonding area 111. It should be noted that, although the first embodiment includes only one heat dissipation pad 221, the number of the heat dissipation pad 221 should not be limited thereto. For example, the heat dissipation pad 221 of the lower metal layer 22 may be divided into four heat dissipation pads 221. When the light emitting device 100 is connected to a circuit board and mounted on a submount, having the four heat dissipation pads 221 could enhance the bonding strength therebetween. In the first embodiment, the four first inner conductors 71 are respectively formed at the two linear shaped pads 213 and the protruded portions 2122 of the two arc shaped pads 212 of the first conducting pads 211, and electrically connect the first conducting pads 211 to the first soldering pads 2221, respectively. The four second inner conductors 72 are respectively formed at the two linear shaped pads 216 and the protruded portions 2152 of the two arc shaped pads 215 of the second conducting pads 214, and electrically connect the second conducting pads 214 to the second soldering pads 2222, respectively.

Figure 4:
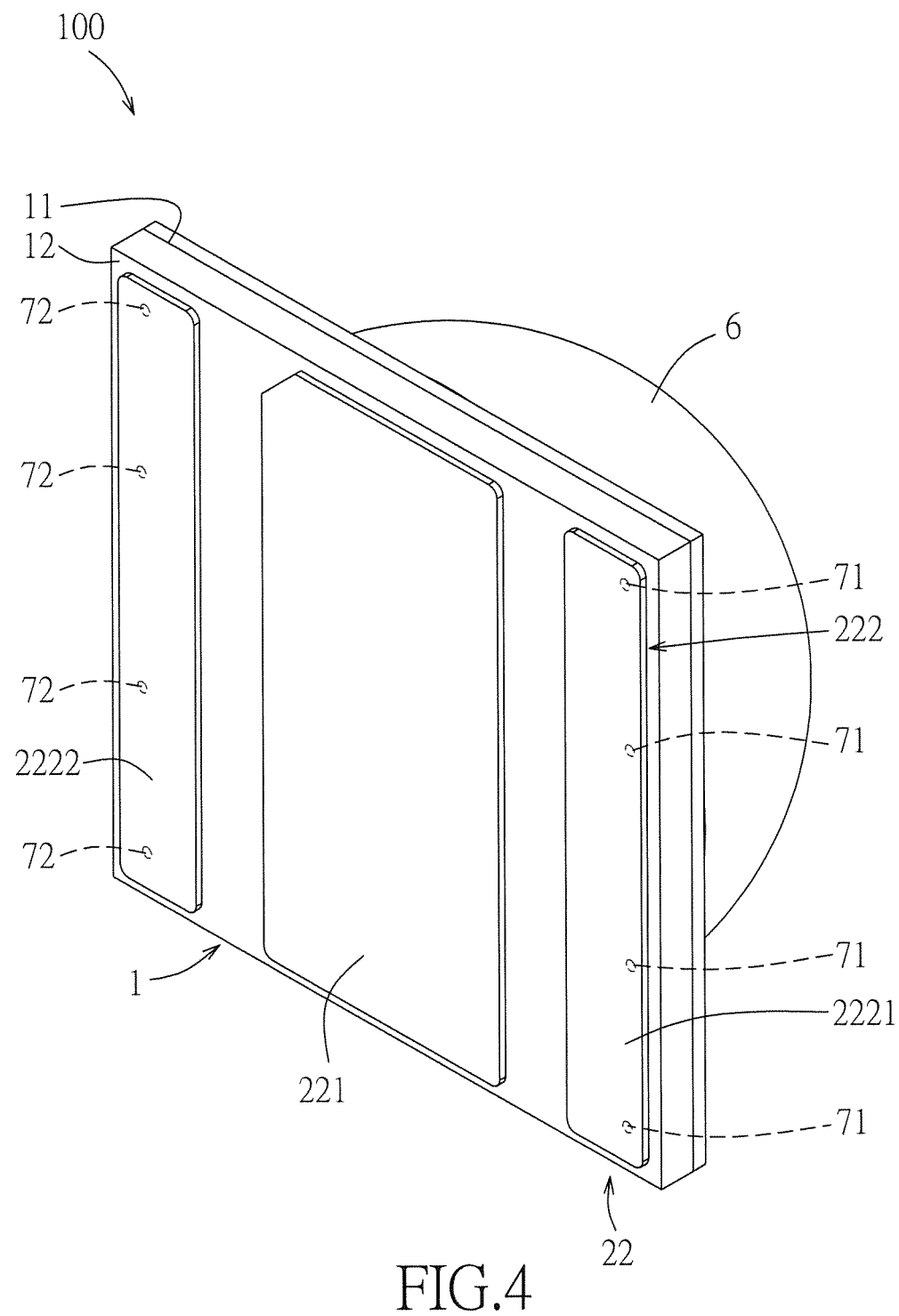
FIG. 4 is a perspective view showing a variation of the lower metal layer included in the first embodiment.
Figure 5:
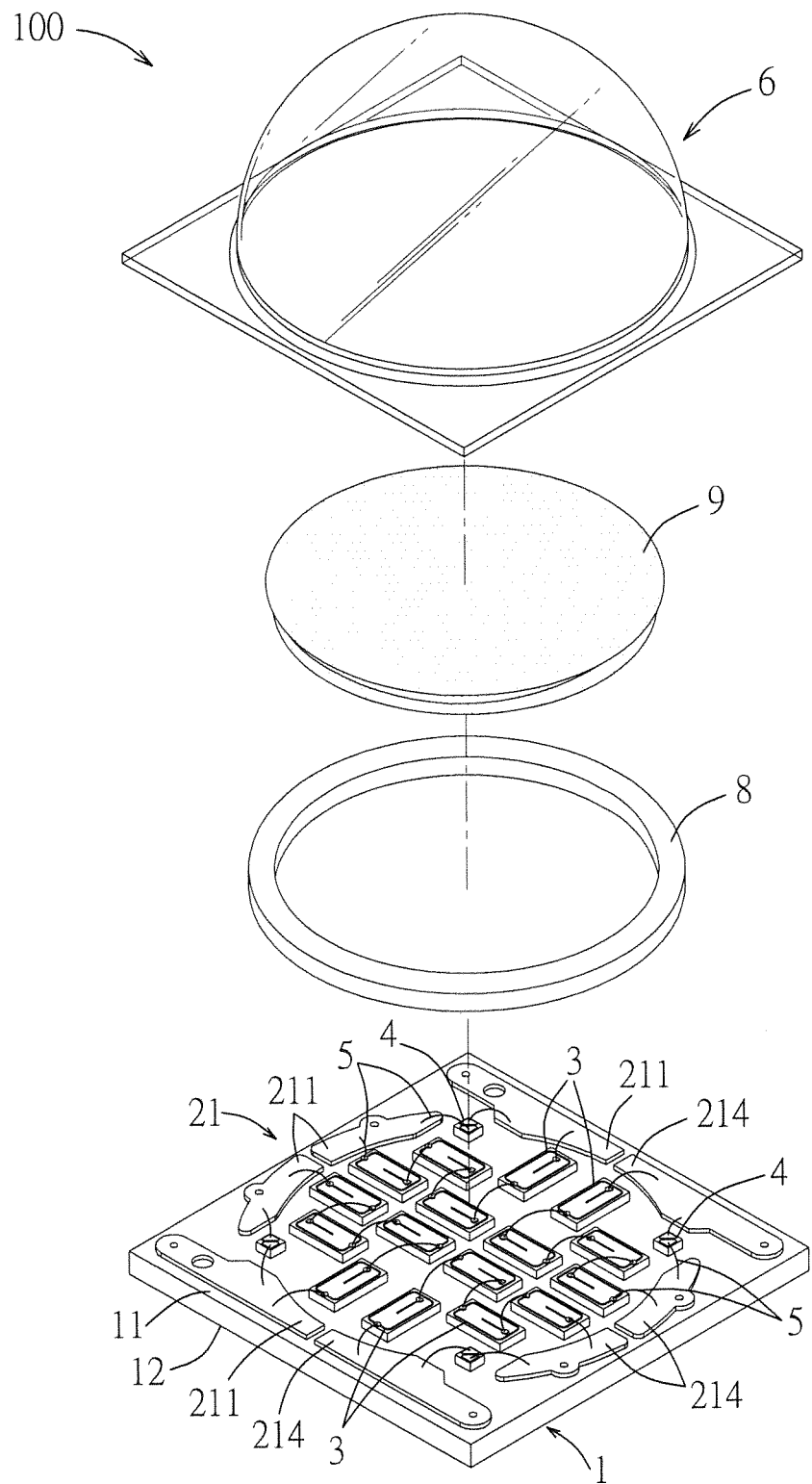
FIG. 5 is an exploded perspective view of a second embodiment of the light emitting device.
Figure 6:
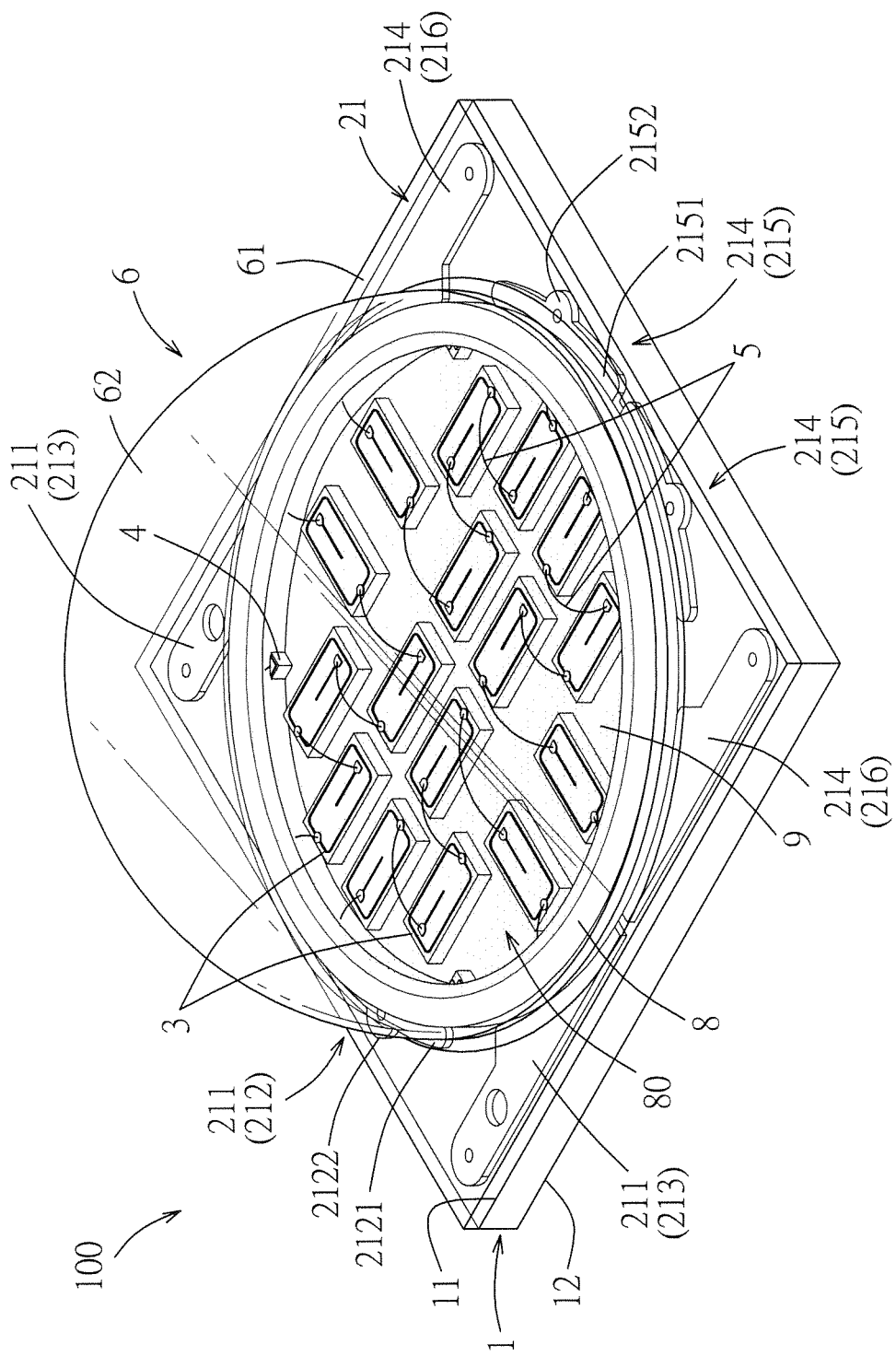
FIG. 6 is a perspective view of the second embodiment.
Figure 7:
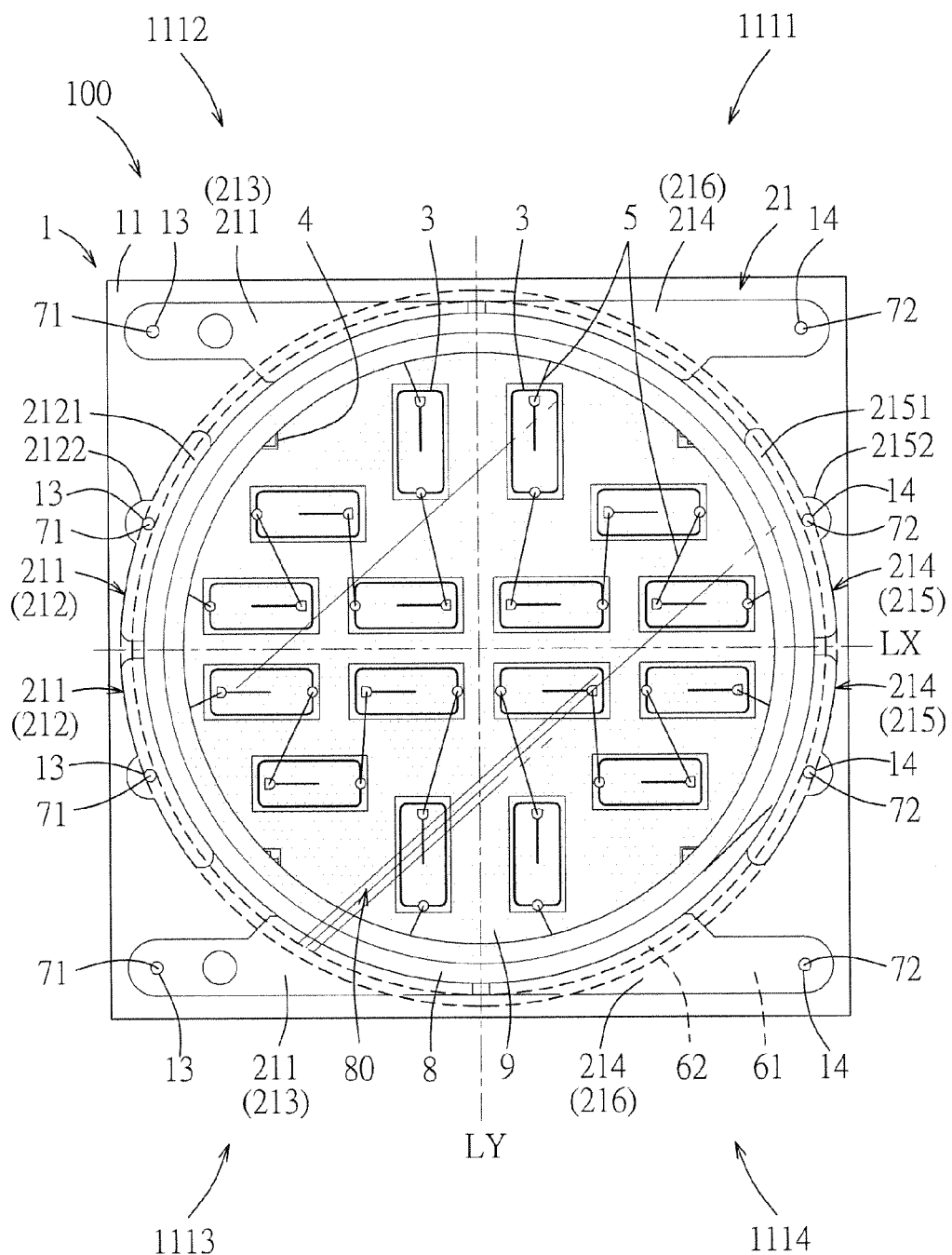
FIG. 7 is a top view of the second embodiment.
Figure 8:
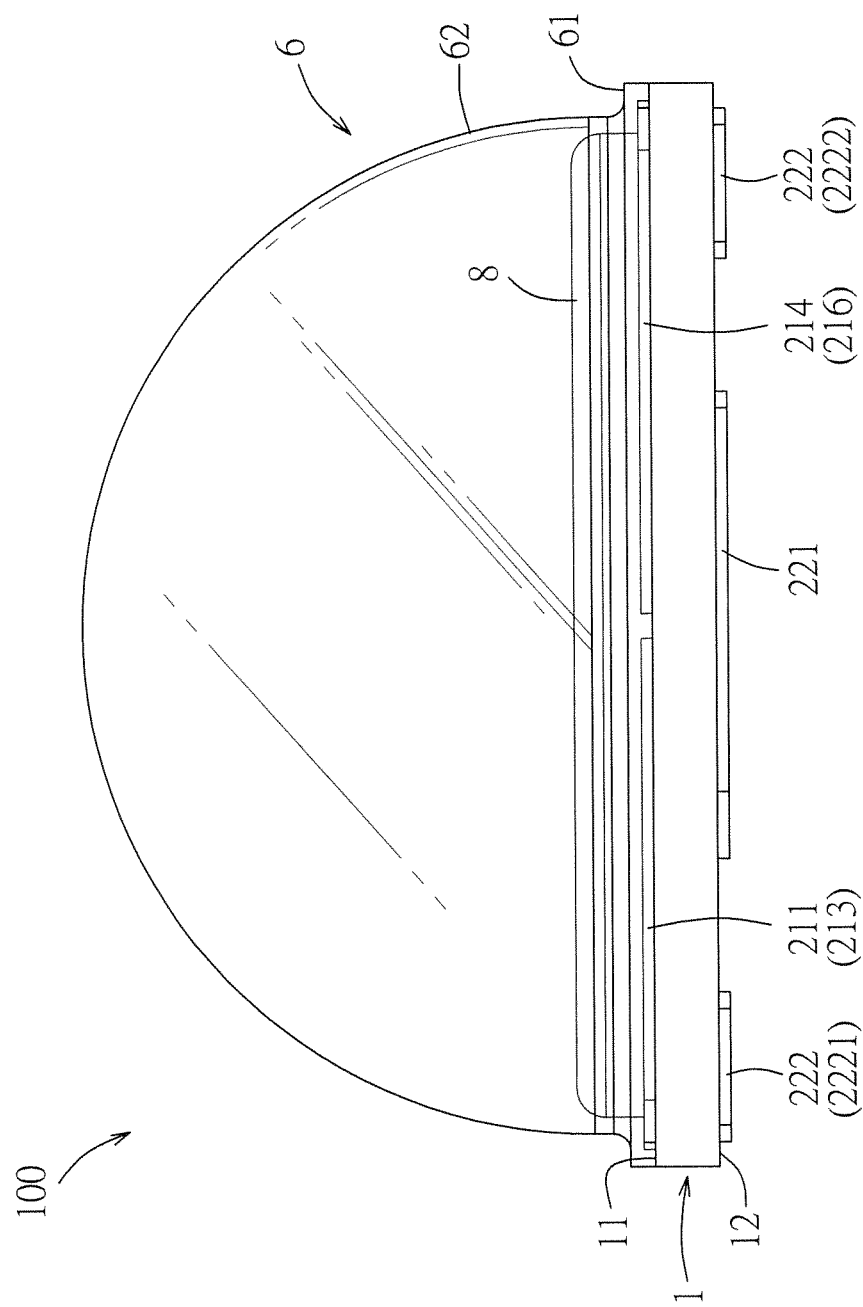
FIG. 8 is a schematic view of the second embodiment.

FIG. 4 shows a variation of the lower metal layer 22 of the light emitting device 100 of the first embodiment, in which the number of the first soldering pad 2221 is one, and the number of the second soldering pad 2222 is one. The first conducting pads 211 (including the two arc shaped pads 212 and the two linear shaped pads 213) are electrically connected to the first soldering pad 2221 via the four first inner conductors 71. The second conducting pads 214 (including the two arc shaped pads 215 and the two linear shaped pads 216) are electrically connected to the second soldering pad 2222 via the four second inner conductors 72.

In the first embodiment, the upper and lower metal layers 21, 22 are formed by a thick film deposition technique (e.g., screen printing technique). Compared to the conventional thin film deposition technique (i.e., direct deposition of copper), the thick film deposition technique used in the first embodiment to form the upper and lower metal layers 21, 22 can reduce substrate cost by 32%.

The LED chips 3 are disposed on the substantially circular die bonding area 111 of the central region. The dimensions of each of the LED chips 3 may be, but is not limited to, 20 mil×40 mil, 22 mil×35 mil, 26 mil×30 mil, or the like. In the first embodiment, each of the LED chips 3 has a rectangular shape of 20 mil×40 mil. As shown in FIG. 2, the substantially circular die bonding area 111 is divided into first, second, third and fourth quadrants 1111, 1112, 1113, 1114 by two imaginary centerlines LX, LY passing through a center of the circle of the outline. The imaginary centerline LX is parallel to the linear shaped pads 213, 216 of the first and second conducting pads 211, 214, and is perpendicular to the imaginary centerline LY. The first, second, third and fourth quadrants 1111, 1112, 1113, 1114 are arranged sequentially in a counterclockwise direction. Certain ones of the LED chips 3 have each a longitudinal side parallel to the imaginary centerline LX (referred as horizontal arrangement hereinafter), and other ones of the LED chips 3 have each a longitudinal side parallel to the imaginary centerline LY (referred as vertical arrangement hereinafter). For example, in FIG. 2, twelve of the LED chips 3 adjacent to the imaginary centerlines LX are disposed in horizontal arrangement and four of the LED chips 3 away from the imaginary centerlines LX are disposed in vertical arrangement. The LED chips 3 in one of the quadrants are arranged mirror-symmetrically to that in an adjacent one of the quadrants. More specifically, the LED chips 3 in the first quadrant 1111 are arranged mirror-symmetrically to that of the LED chips 3 in the second quadrant 1112 relative to the imaginary centerline LY. The LED chips 3 in the second quadrant 1112 are arranged mirror-symmetrically to that of the LED chips 3 in the third quadrant 1113 relative to the imaginary centerline LX. The LED chips 3 in the third quadrant 1113 are arranged mirror-symmetrically to that of the LED chips 3 in the fourth quadrant 1114 relative to the imaginary centerline LY. The LED chips 3 in the fourth quadrant 1114 are arranged mirror-symmetrically to that of the LED chips 3 in the first quadrant 1111 relative to the imaginary centerline LX. As shown in FIG. 2, a shortest distance (A1) between two adjacent ones of the LED chips 3 ranges from 0.15 mm to 0.6 mm to prevent one of the LED chips 3 from absorbing the light emitted from an adjacent one of the LED chips 3. Therefore, the LED chips 3 have superior light extraction efficiency. It is worth mentioning that, in the first embodiment, a die bonding pad is not formed on the substantially circular die bonding area 111 and the polygonal extension areas 112. As such, the problem that the die bonding pad may be incapable of reflecting light emitted by the LED chips 3 due to sulfurization of the die bonding pad can be prevented. The substrate 1 in the first embodiment is a high-reflection substrate that effectively reflects the light emitted from the LED chips 3, thereby enhancing the light extraction efficiency of the light emitting device 100. Furthermore, heat generated by the LED chips 3 could be dissipated through the substrate 1 and the heat dissipation pad 221, thereby enhancing heat dissipation of the light emitting device 100.

In this embodiment, four Zener diodes 4 are included in the light emitting device 100 and are respectively disposed on the polygonal extension areas 112 of the central region formed outside the substantially circular die bonding area 111. In such arrangement, the Zener diodes 4 would not occupy the substantially circular die bonding area 111 and may thereby be prevented from blocking the light emitted from the LED chips 3 located on the substantially circular die bonding area 111, so that light extraction efficiency of the light emitting device 100 is enhanced. In the first embodiment, the LED chips 3 are directly disposed on the substantially circular die bonding area ill. The Zener diodes 4 are respectively and directly disposed on the polygonal extension areas 112.

The conductive wires 5 electrically interconnect the LED chips 3, the Zener diodes 4, the first conducting pads 211 and the second conducting pads 214 to form at least one conducting loop. In the first embodiment, the LED chips 3 are connected to form four conducting loops via the conductive wires 5, where each of the conducting loops includes four of the LED chips 3. However, the LED chips 3 may be connected in various series connections or various parallel connections as shown in FIGS. 14 to 19, which will be described in detail hereinafter. Besides, as shown in FIG. 2, a shortest distance (A2) between two adjacent ones of the conductive wires 5 ranges from 0.3 mm to 1.3 mm to prevent the breaking of wires due to thermal shock.

As shown in FIG. 1, the encapsulant 6 has a base portion 61 and a lens portion 62 connected to the base portion 61. The base portion 61 is formed on the top surface 11 of the substrate 1. The encapsulant 6 has a normal projection that substantially corresponds in size and in position to the substrate 1. That is to say, a periphery of the base portion 61 of the encapsulant 6 is substantially flush with that of the substrate 1. Each of the main portions 2121, 2151 of the arc shaped pads 212, 215 of the first and second conducting pads 211, 214 has an outer edge connected to a respective one of the protruded portions 2122, 2152. A periphery of the lens portion 62 substantially coincides with outer edges of the main portions 2121, 2151 of the arc shaped pads 212, 215 of the first and second conducting pads 211, 214 to cover the LED chips 3 and the Zener diodes 4, leaving the protruded portions 2122, 2152 of the arc shaped pads 212, 215 of the first and second conducting pads 211, 214 uncovered. It is worth mentioning that the bonding strength between the encapsulant 6 and a metallic material (i.e., the upper metal layer 21) would be inferior to that between the encapsulant 6 and a ceramic material. In the first embodiment, the area of the upper metal layer 21 is reduced to increase an effective reflection area of the substrate 1. As such, the bonding strength between the encapsulant 6 and the substrate 1 is increased. In addition, a fluorescent material may be mixed into the encapsulant 6 to alter the wavelength of the light emitted from the LED chips 3, thereby providing the light with diverse wavelengths for subsequent lighting purposes.

Second Embodiment

Figure 9:
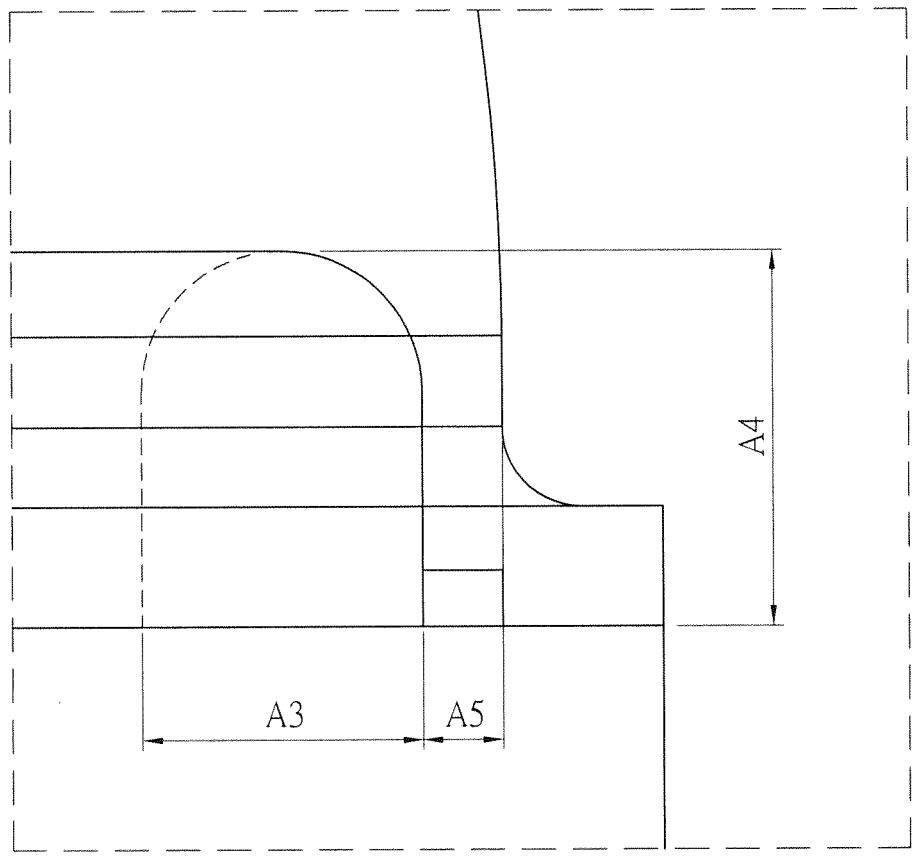
FIG. 9 is a partly enlarged view showing a dimension of a surrounding wall and a distance between the surrounding wall and a base portion of an encapsulant of the second embodiment.

Referring to FIGS. 5 to 9, a second embodiment of the light emitting device 100 according to the present invention has a structure similar to that of the first embodiment. The differences are described hereafter. In the second embodiment, the light emitting device 100 further includes a surrounding wall 8 and a luminescent layer 9 that are disposed on the top surface 11 of the substrate 1. The surrounding wall 8 is disposed on the first conducting pads 211 (including the two arc shaped pads 212 and the two linear shaped pads 213) and the second conducting pads 214 (including the two arc shaped pads 215 and the two linear shaped pads 216), and surrounds the central region. To be more specific, the surrounding wall 8 covers part of each of the first conducting pads 211 (i.e., part of each of the two arc shaped pads 212 and the two linear shaped pads 213), part of each of the second conducting pads 214 (i.e., part of each of the two arc shaped pads 215 and the two linear shaped pads 216), and part of each of the Zener diodes 4, leaving the protruded portions 2122, 2152 of the arc shaped pads 212, 215 of the first and second conducting pads 211, 214 uncovered and protruded outside of the surrounding wall 8. Preferably, the surrounding wall 8 covers an inner half of each of the main portions 2121, 2151 of the arc shaped pads 212, 215 of the first and second conducting pads 211 and exposes a respective one of the protruded portions 2122, 2152 and an outer half of the each of the main portions 2121, 2151 of the arc shaped pads 212, 215, which extends from the inner half oppositely of the central region. By leaving the protruded portions 2122, 2152 protruded outside of the surrounding wall 8, the surrounding wall 8 can be more firmly bonded to the flat main portions 2121, 2151 of the first and second conducting pads 211, 214. Also, the possibility of wires breaking due to an uneven wiring pattern could be reduced. In addition, by covering and embedding part of the Zener diodes 4 within the surrounding wall 8, blockage of the light emitted from the LED chips 3 attributed to the Zener diodes 4 can be reduced, thereby enhancing the light extraction efficiency of the light emitting device 100. The surrounding wall 8 cooperates with the top surface 11 of the substrate 1 to define a receiving space 80. The luminescent layer 9 is disposed in the receiving space 80 and covers the LED chips 3. Likewise, the surrounding wall 8 and the luminescent layer 9 are covered by the encapsulant 6. With the surrounding wall 8, the luminescent layer 9 may be formed in the receiving space by a glue dispensing technique, thereby reducing the amount of phosphor powder required to form the luminescent layer 9 and reducing manufacturing costs of the light emitting device 100 as compared to the spray coating technique. As shown in FIG. 9, the surrounding wall 8 has a thickness (A3) of 0.3 mm in a radial direction and a height (A4) of 0.4 mm from the top surface 11 of the substrate 1. A non-limiting example of a shortest distance (A5) between an outer periphery of the surrounding wall 8 and the periphery of the base portion 61 of the encapsulant 6 is 0.15 mm. In other embodiments, the thickness (A3) and the height (A4) of the surrounding wall 8 may respectively range from 0.3 mm to 0.7 mm and from 0.3 mm to 0.8 mm.

In the second embodiment, the lower metal layer 22 of the light emitting device 100 has the same configuration as that of the first embodiment. The soldering pad assembly 222 of the lower metal layer 22 may include four first soldering pads 2221 and four second soldering pads 2222 (see FIG. 3), or may include one first soldering pad 2221 and one second soldering pad 2222 (see FIG. 4). The connection among the first conducting pads 211, the second conducting pads 214 and the soldering pad assembly 222 is the same as that of the first embodiment, and therefore will not be further elaborated herein for the sake of brevity.

Third Embodiment

Figure 10:
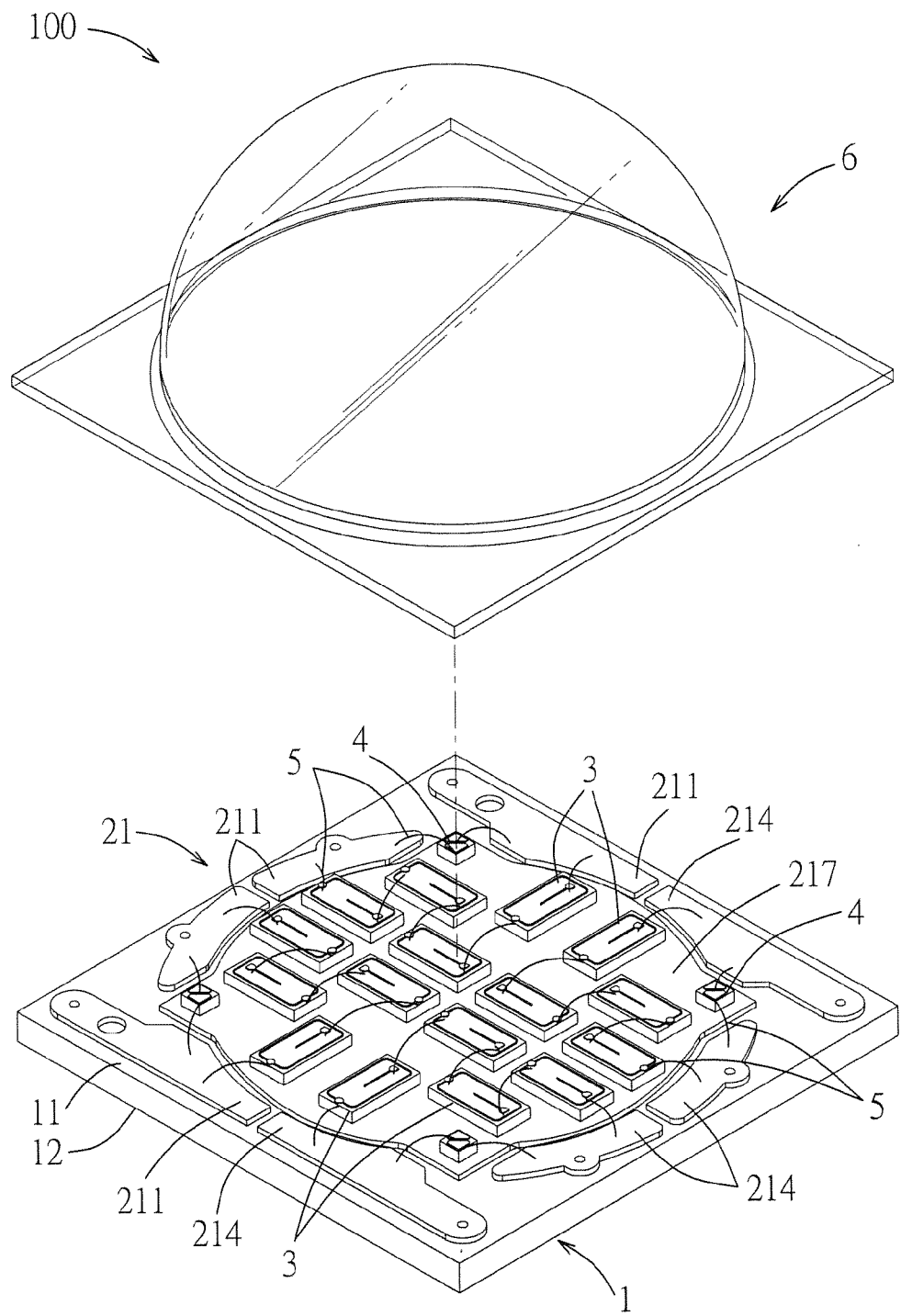
FIG. 10 is an exploded perspective view of a third embodiment of the light emitting device.
Figure 11:
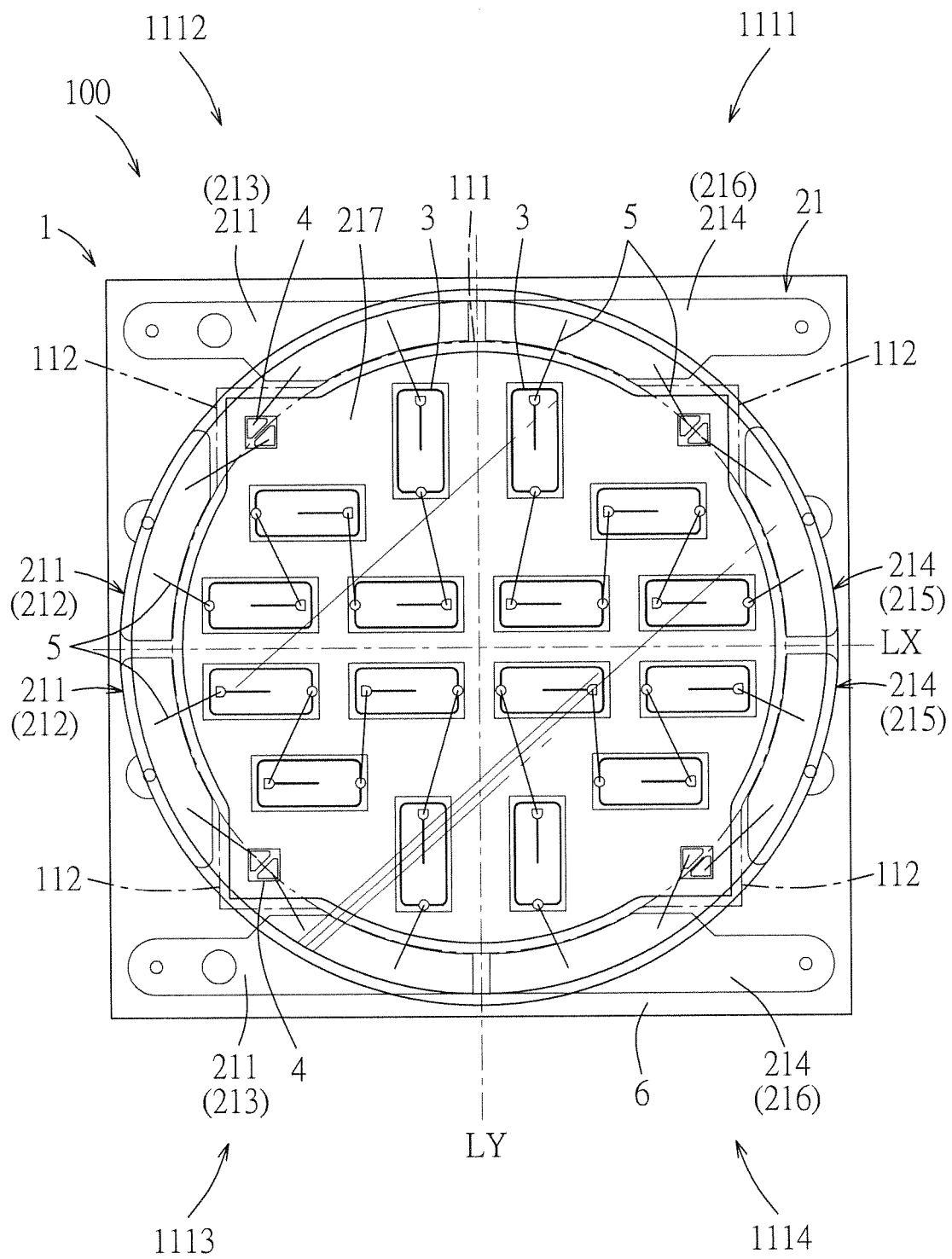
FIG. 11 is a top view of the third embodiment.

Referring to FIGS. 10 and 11, a third embodiment of the light emitting device 100 according to the present invention has a structure similar to that of the first embodiment. The differences are described hereafter. In the third embodiment, the upper metal layer 21 further includes a die bonding pad 217 that covers the substantially circular die bonding area 111 and the polygonal extension areas 112. The die bonding pad 217 carries the LED chips 3 and the Zener diodes 4. In the second embodiment, the die bonding pad 217 has a profile conforming to that of the imaginary boundary bounding the central region. The die bonding pad 217 is spaced apart from the first conducting pads 211 (including the two arc shaped pads 212 and the two linear shaped pads 213) and the second conducting pads 214 (including the two arc shaped pads 215 and the two linear shaped pads 216). The die bonding pad 217 can dissipate heat generated by the LED chips 3.

In the third embodiment, the lower metal layer 22 of the light emitting device 100 has the same configuration as that of the first embodiment. The soldering pad assembly 222 of the lower metal layer 22 may include four first soldering pads 2221 and four second soldering pads 2222 (see FIG. 3) or may include one first soldering pad 2221 and one second soldering pad 2222 (see FIG. 4). The connection among the first conducting pads 211, the second conducting pads 214 and the soldering pad assembly 222 is the same as that of the first embodiment, and therefore will not be further elaborated herein for the sake of brevity.

Fourth Embodiment

Figure 12:
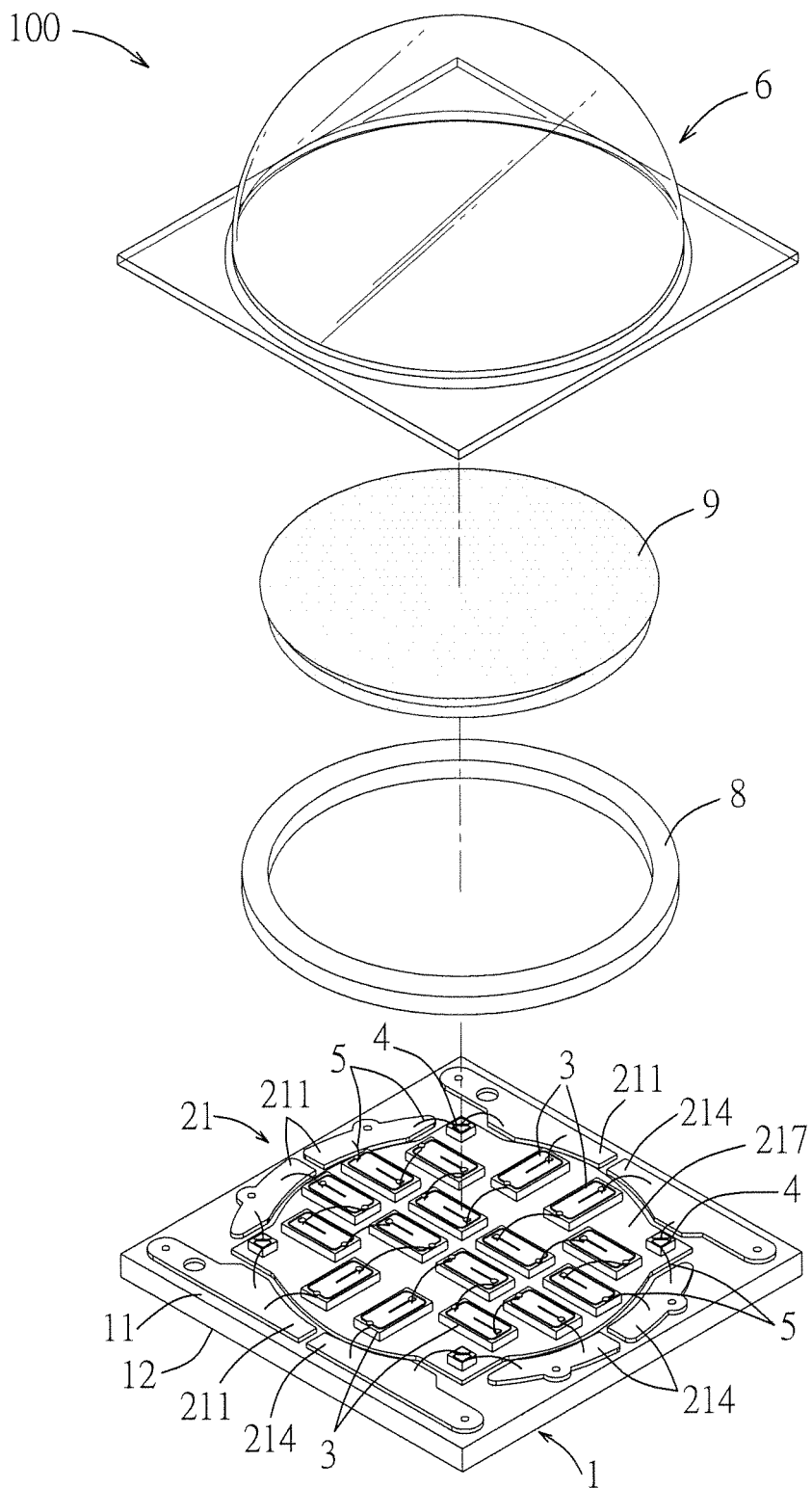
FIG. 12 is an exploded perspective view of a fourth embodiment of the light emitting device.
Figure 13:
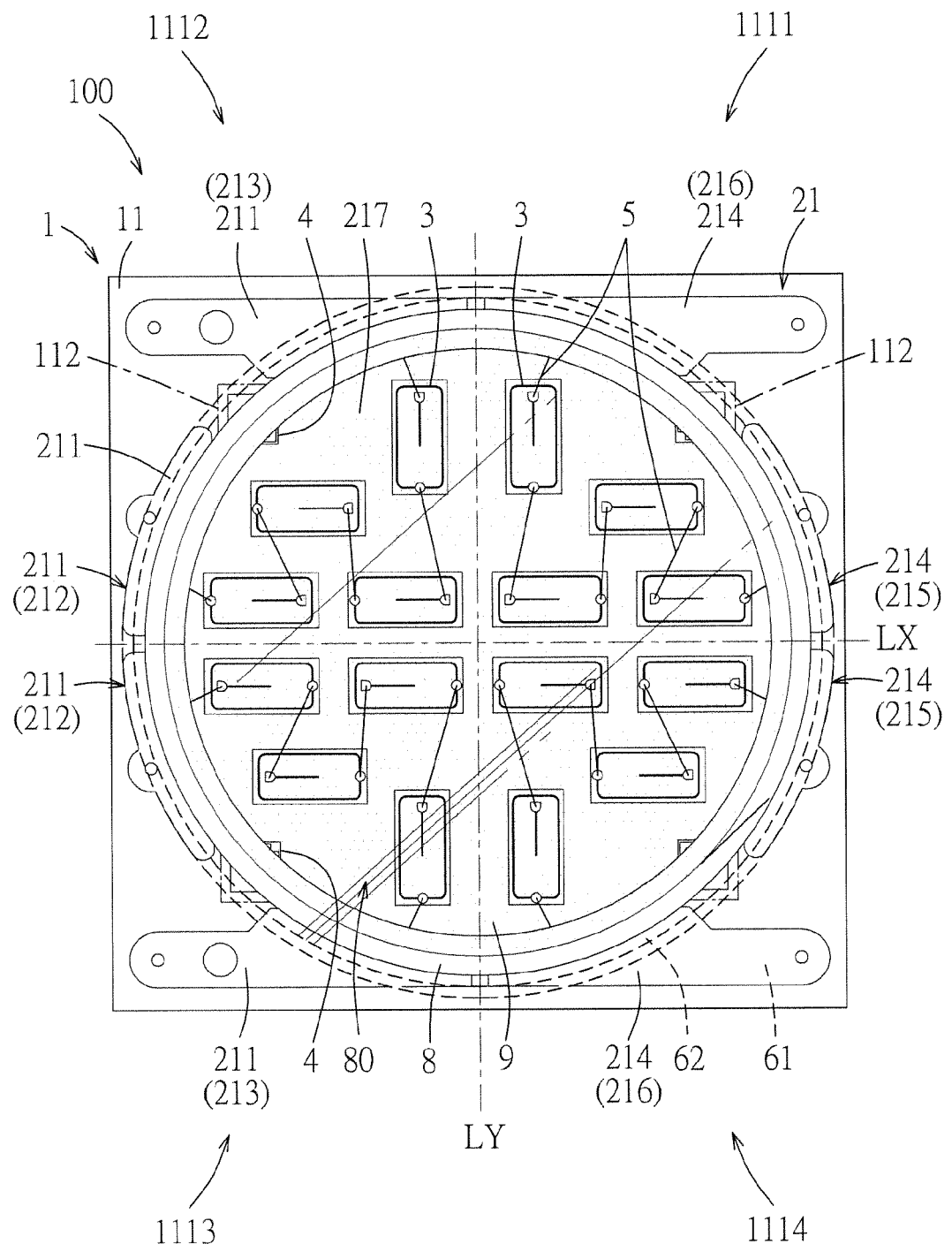
FIG. 13 is a top view of the fourth embodiment, showing a first type of LED chip arrangement according to the present invention.

Referring to FIGS. 12 and 13, a fourth embodiment of the light emitting device 100 according to the present invention has a structure similar to that of the second embodiment. The differences are described hereafter. In the fourth embodiment, the upper metal layer 21 further includes a die bonding pad 217 that covers the substantially circular die bonding area 111 and the polygonal extension areas 112. The die bonding pad 217 carries the LED chips 3 and the Zener diodes 4. The surrounding wall 8 is not only disposed on the first conducting pads 211 (including the two arc shaped pads 212 and the two linear shaped pads 213) and the second conducting pads 214 (including the two arc shaped pads 215 and the two linear shaped pads 216), but also on the die bonding pad 217. It should be noted that parts of the die bonding pad 217 disposed on the polygonal extension areas 112 are protruded outside of the surrounding wall 8.

In the fourth embodiment, the lower metal layer 22 of the light emitting device 100 has the same configuration as that of the first embodiment. The soldering pad assembly 222 of the lower metal layer 22 may include four first soldering pads 2221 and four second soldering pads 2222 (see FIG. 3) or may include one first soldering pad 2221 and one second soldering pad 2222 (see FIG. 4). The connection among the first conducting pads 211, the second conducting pads 214 and the soldering pad assembly 222 is the same as that of the first embodiment, and therefore will not be further elaborated herein for the sake of brevity.

The arrangement of the LED chips 3 is not limited to the first type shown in the previous embodiments. FIGS. 14 to 19 illustrates six other different types (i.e., second to seventh types) of arrangements of the LED chips 3 in combination with arrangements of the conductive wires 5 to form different connections of the LED chips 3 in series, in parallel, or in combinations thereof.

Figure 14:
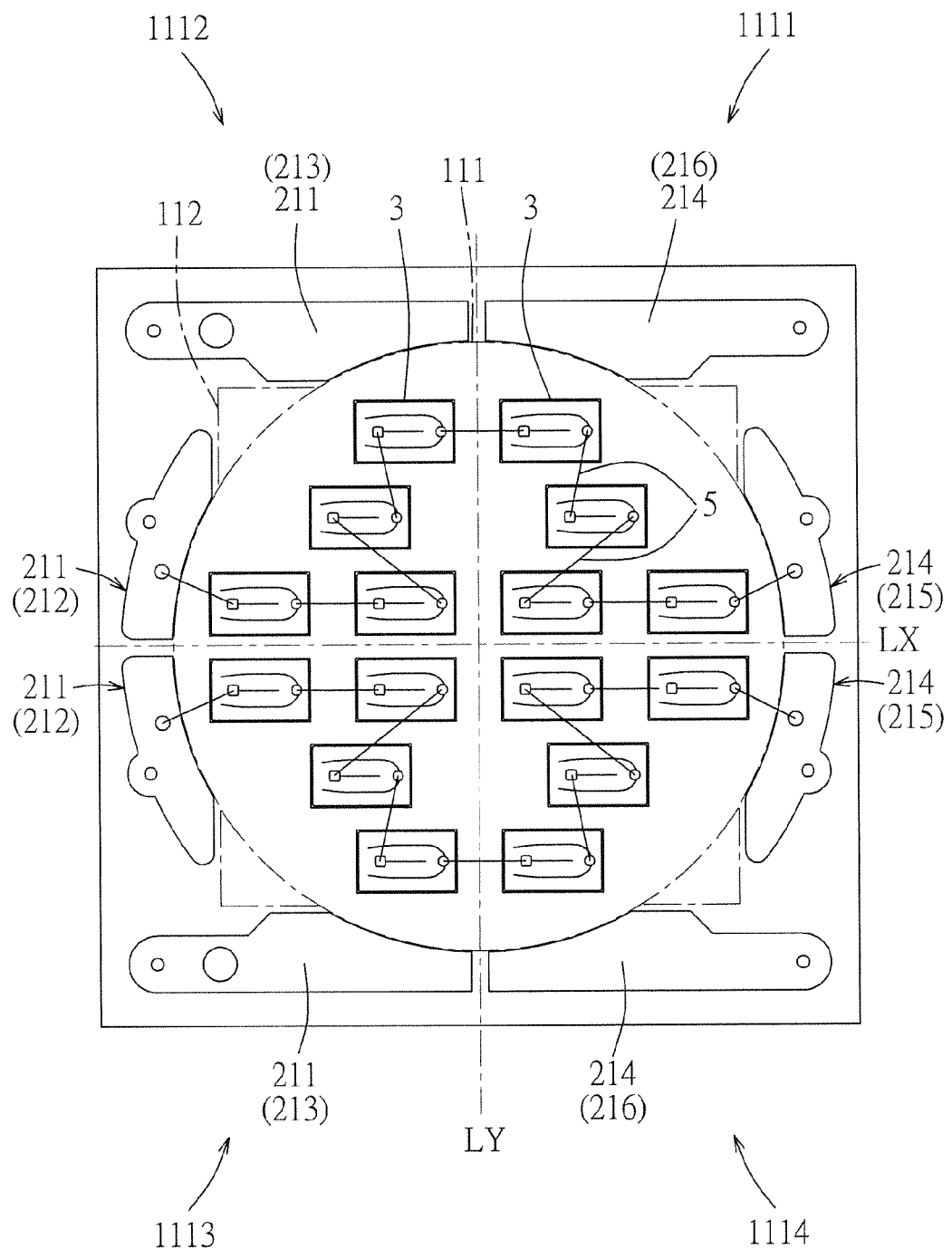
FIG. 14 is a top view showing a second type of LED chip arrangement according to the present invention.

FIG. 14 illustrates a second type of arrangement of the LED chips 3. Each of the LED chips 3 has dimensions of 22 mil×35 mil. The LED chips 3 form two series conducting loops. Each of the series conducting loops includes eight LED chips 3. Sixteen LED chips 3 are disposed on the substantially circular die bonding area 111 in horizontal arrangement. One of the series conducting loops is disposed on the first and second quadrants 1111, 1112, is omega shaped, and is connected to one of the arc shaped pads 212 (e.g., the top left one shown in FIG. 14) of the first conducting pads 211 and one of the arc shaped pads 215 (e.g., the top right one shown in FIG. 14) of the second conducting pads 214 via the conductive wires 5. The other one of the series conducting loops is disposed on the third and fourth quadrants 1113, 1114, is also omega shaped, and is connected to the other one of the arc shaped pads 212 (e.g., the bottom left one shown in FIG. 14) of the first conducting pads 211 and the other one of the arc shaped pads 215 (e.g., the bottom right one shown in FIG. 14) of the second conducting pads 214 via the conductive wires 5. The series conducting loops are mirror-symmetrical to each other relative to the imaginary centerline LX. The LED chips 3 in one of the quadrants are arranged mirror-symmetrically to those in an adjacent one of the quadrants.

In this arrangement, when a diameter of the substantially circular die bonding area 111 is 5.2 mm, the area of the substantially circular die bonding area 111 is 21.2372 mm². The LED chips 3 occupy 37.4% of the area of the substantially circular die bonding area 111.

Figure 15:
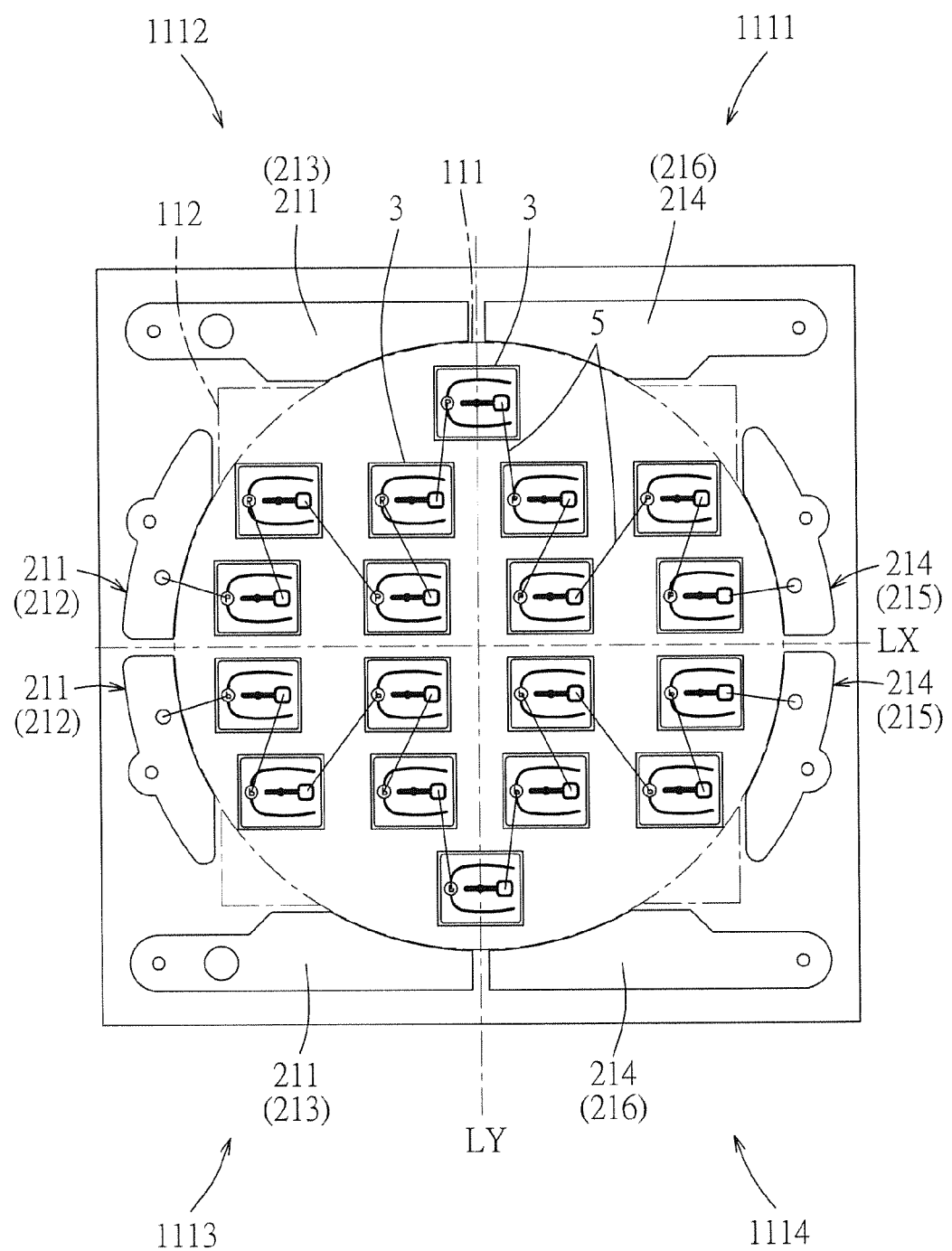
FIG. 15 is a top view showing a third type of LED chip arrangement according to the present invention.

FIG. 15 illustrates a third type of arrangement of the LED chips 3. Each of the LED chips 3 has dimensions of 26 mil×30 mil. The LED chips 3 form two series conducting loops. Each of the series conducting loops includes nine LED chips 3. Eighteen LED chips 3 are disposed on the substantially circular die bonding area 111 in horizontal arrangement. One of the series conducting loops is disposed on the first and second quadrants 1111, 1112, and is connected to one of the arc shaped pads 212 (e.g., the top left one shown in FIG. 15) of the first conducting pads 211 and one of the arc shaped pads 215 (e.g., the top right one shown in FIG. 15) of the second conducting pads 214 via the conductive wires 5. The other one of the series conducting loops is disposed on the third and fourth quadrants 1113, 1114, and is connected to the other one of the arc shaped pads 212 (e.g., the bottom left one shown in FIG. 15) of the first conducting pads 211 and the other one of the arc shaped pads 215 (e.g., the bottom right one shown in FIG. 15) of the second conducting pads 214 via the conductive wires 5. The LED chips 3 in one of the quadrants are arranged mirror-symmetrically to those in an adjacent one of the quadrants.

In this arrangement, when a diameter of the substantially circular die bonding area 111 is 5.2 mm, the area of the substantially circular die bonding area 111 is 21.2372 mm$^2$. The LED chips 3 occupy 42.6% of the area of the substantially circular die bonding area 111, thereby resulting in a most efficient utilization of the substantially circular die bonding area 111.

Figure 16:
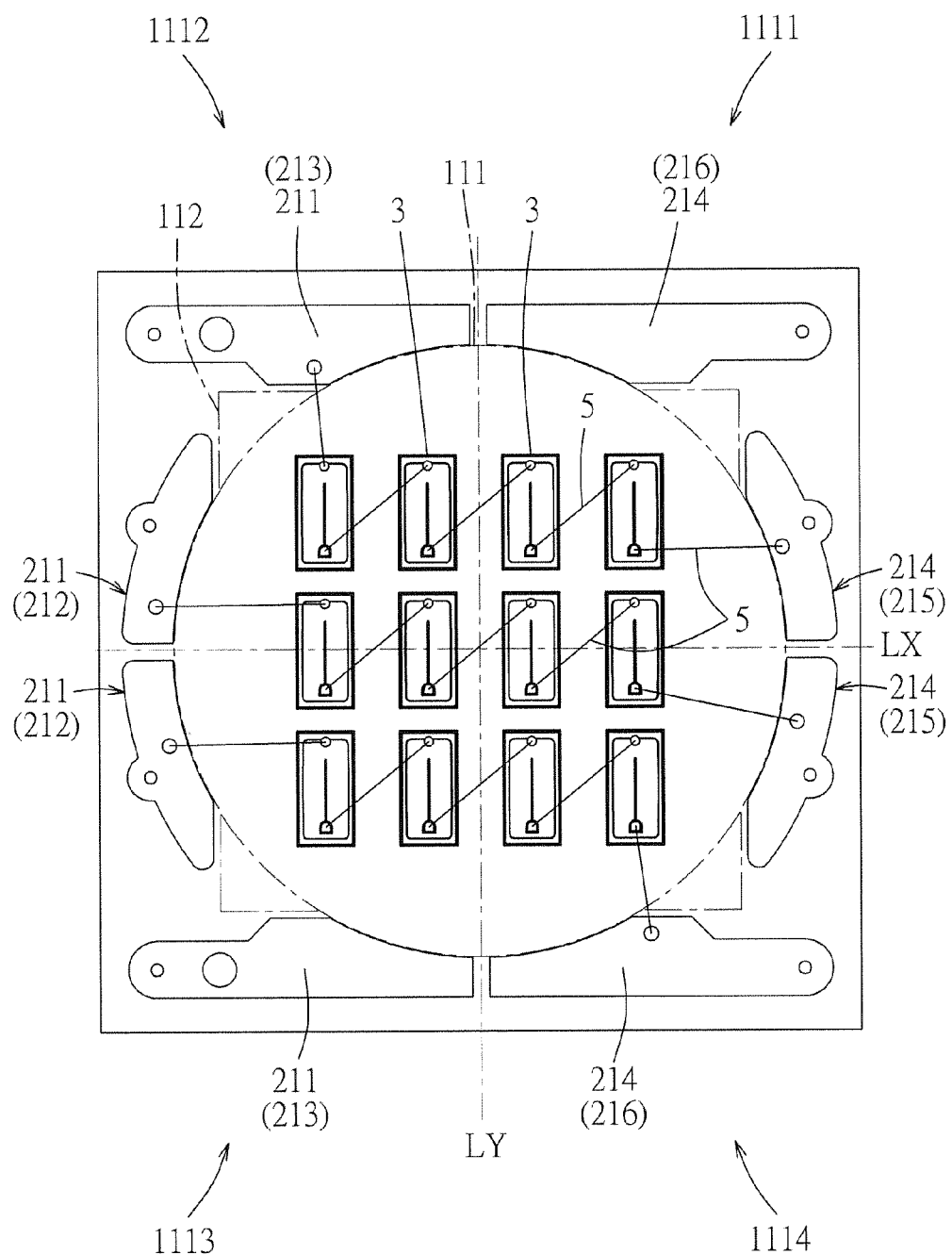
FIG. 16 is a top view showing a fourth type of LED chip arrangement according to the present invention.

FIG. 16 illustrates a fourth type of arrangement of the LED chips 3. Each of the LED chips 3 has dimensions of 20 mil×40 mil. The LED chips 3 form three series conducting loops. Each of the series conducting loops includes four LED chips 3. Twelve LED chips 3 are disposed on the substantially circular die bonding area 111 in a 4×3 matrix and in vertical arrangement. A first series conducting loop is connected to one of the linear shaped pads 213 (e.g., the top left one shown in FIG. 16) of the first conducting pads 211 and one of the arc shaped pads 215 (e.g., the top right one shown in FIG. 16) of the second conducting pads 214 via the conductive wires 5. A second series conducting loop is connected to one of the arc shaded pads 212 (e.g., the bottom left one shown in FIG. 15) of the first conducting pads 211 and the other one of the arc shaped pads 215 (e.g., the bottom right one shown in FIG. 16) of the second conducting pads 214 via the conductive wires 5. A third series conducting loop is connected to the other one of the arc shaped pads 212 (e.g., the bottom left one shown in FIG. 16) of the first conducting pads 211 and the other one of the linear shaped pads 216 (e.g., the bottom right one shown in FIG. 16) of the second conducting pads 214 via the conductive wires 5.

In this arrangement, when a diameter of the substantially circular die bonding area 111 is 5.2 mm, the area of the substantially circular die bonding area 111 is 21.2372 mm$^2$. The LED chips 3 occupy 29.2% of the area of the substantially circular die bonding area 111.

Figure 17:
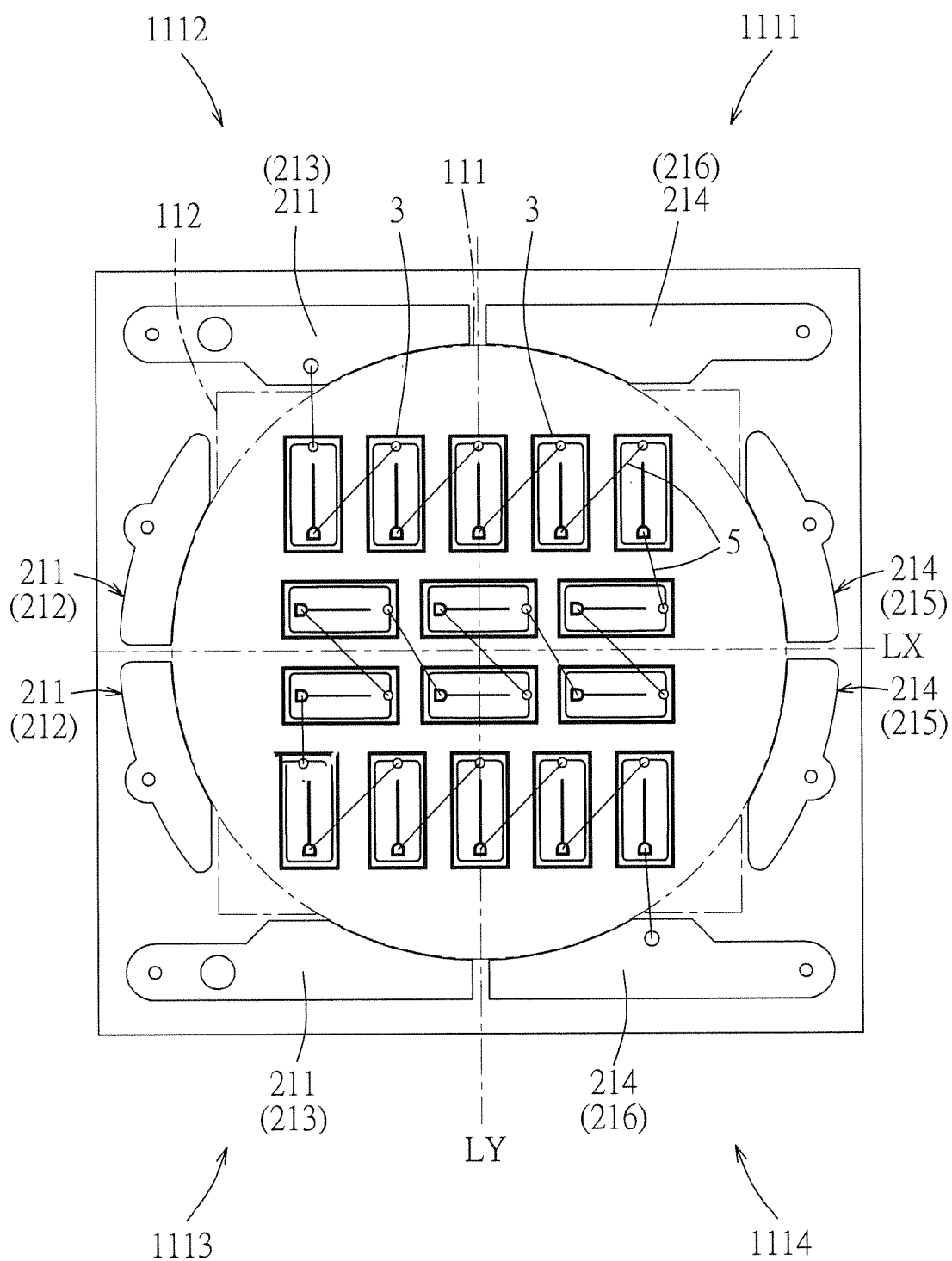
FIG. 17 is a top view showing a fifth type of LED chip arrangement according to the present invention.

FIG. 17 illustrates a fifth type of arrangement of the LED chips 3. Sixteen LED chips 3 each having dimensions of 20 mil×40 mil are used in this arrangement to form a series conducting loop. The LED chips 3 are arranged in four rows relative to the imaginary centerline LX. The first row includes five of the LED chips 3, each of which is in vertical arrangement. A second row and a third row respectively include three of the LED chips 3, each of which is in horizontal arrangement. A fourth row includes five of the LED chips 3, each of which is in vertical arrangement. The series conducting loop is connected to one of the linear shaped pads 213 (e.g., the top left one shown in FIG. 17) of the first conducting pads 211 and one of the linear shaped pads 216 (e.g., the bottom right one shown in FIG. 17) of the second conducting pads 214 via the conductive wires 5. The LED chips 3 in one of the quadrants are arranged mirror-symmetrically to those in an adjacent one of the quadrants.

In this arrangement, when a diameter of the substantially circular die bonding area 111 is 5.2 mm, the area of the substantially circular die bonding area 111 is 21.2372 mm$^2$. The LED chips 3 occupy 38.9% of the area of the substantially circular die bonding area 111, thereby allowing the substantially circular die bonding area 111 to carry a greater number of larger sized LED chips 3.

Figure 18:
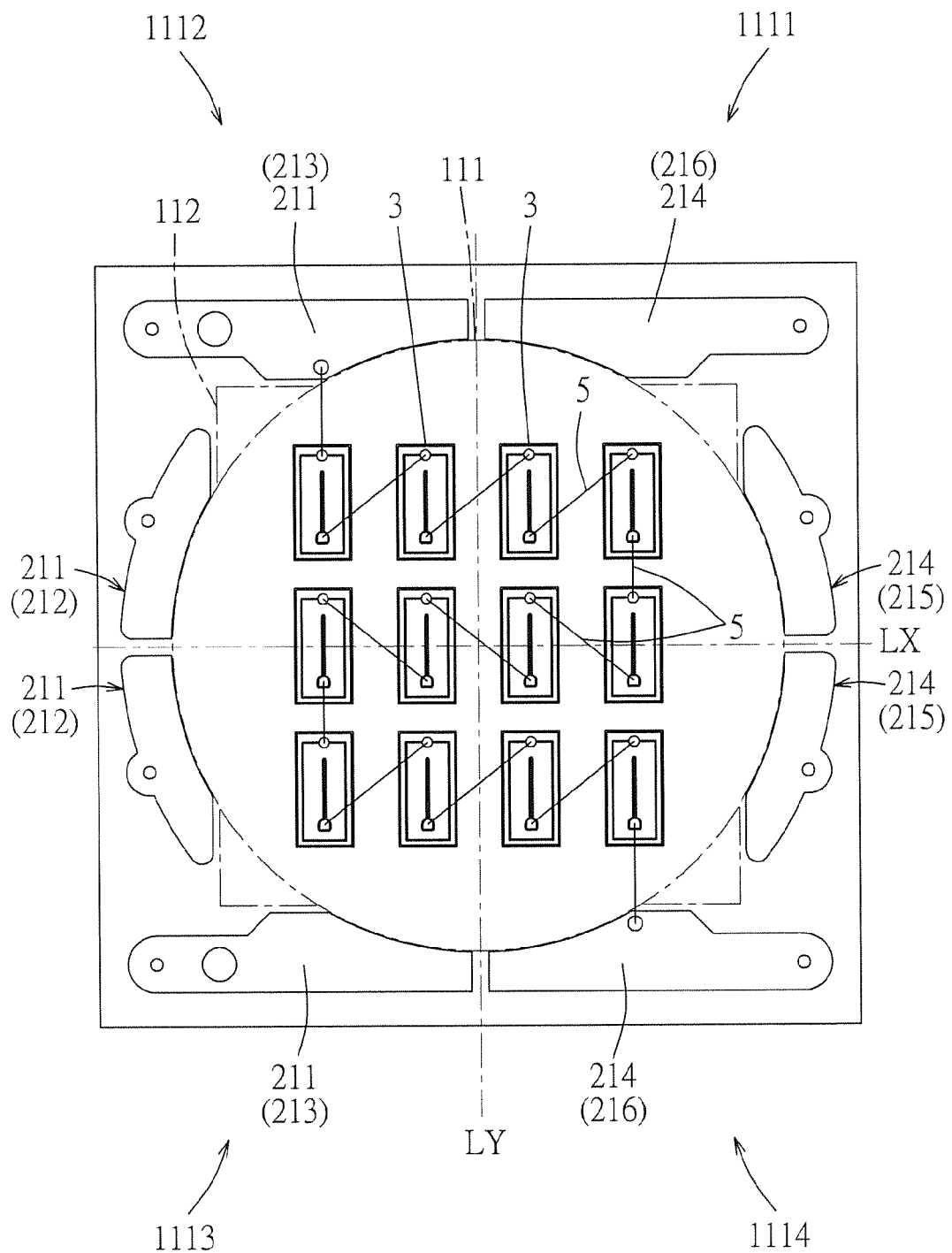
FIG. 18 is a top view showing a sixth type of LED chip arrangement according to the present invention.

FIG. 18 illustrates a sixth type of arrangement of the LED chips 3. Twelve LED chips 3 each having dimensions of 20 mil×40 mil used in this arrangement to form a series conducting loop. The twelve LED chips 3 are arranged on the substantially circular die bonding area 111 in a 4×3 matrix. The series conducting loop is connected to one of the linear shaped pads 213 (e.g., the top left one shown in FIG. 18) of the first conducting pads 211 and one of the linear shaped pads 216 (e.g., the bottom right one shown in FIG. 18) of the second conducting pads 214 via the conductive wires 5. In other words, the LED chips 3 are only connected to two of the linear shaped pads 213, 216 by the conductive wires 5 to form the series conducting loop.

In this arrangement, when a diameter of the substantially circular die bonding area 111 is 5.2 mm, the area of the substantially circular die bonding area 111 is 21.2372 mm$^2$. The LED chips 3 occupy 29.2% of the area of the substantially circular die bonding area 111.

Figure 19:
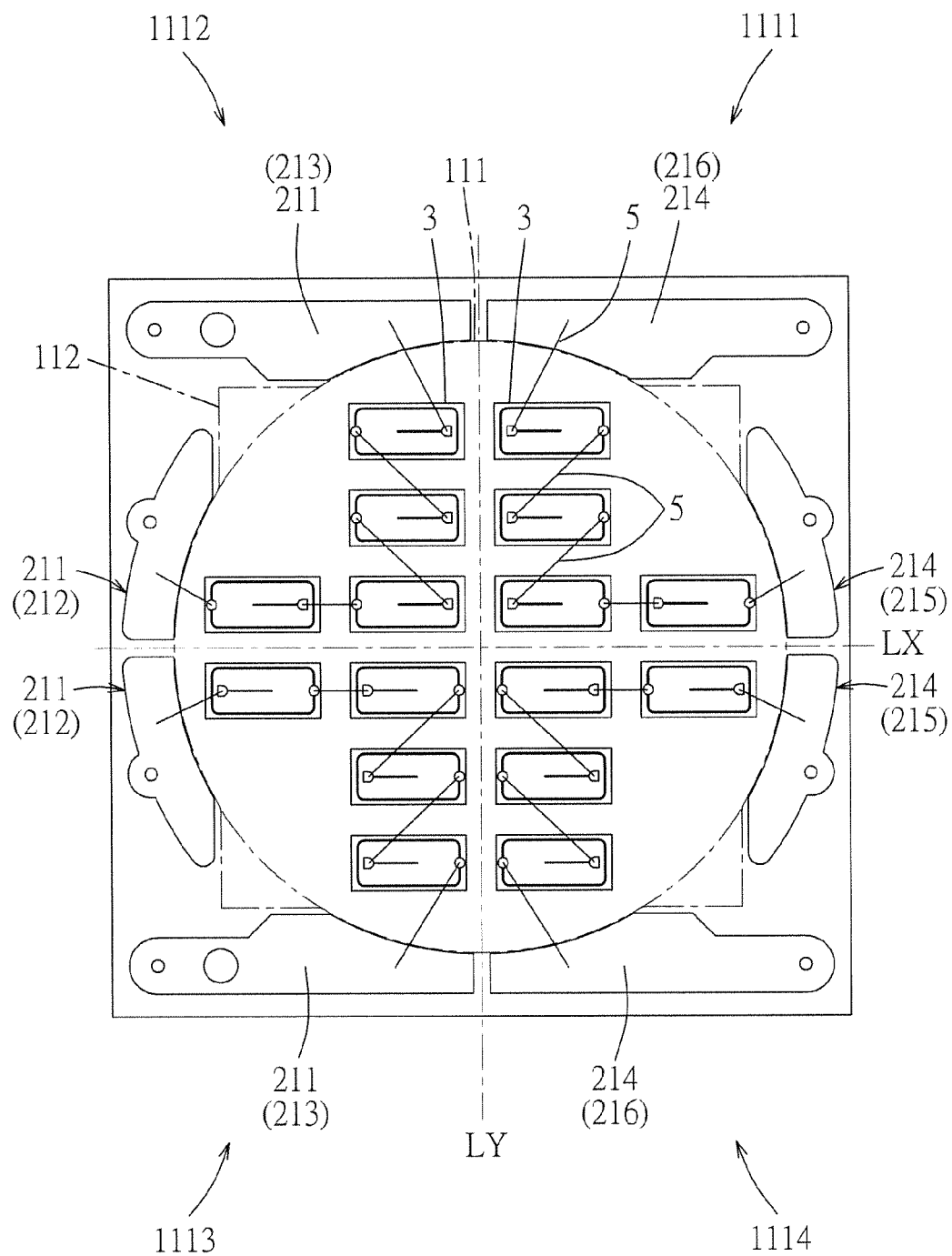
FIG. 19 is a top view showing a seventh type of LED chip arrangement according to the present invention.

FIG. 19 illustrates a seventh type of arrangement of the LED chips 3. The LED chips 3 used in this arrangement each has dimensions of 20 mil×40 mil. The LED chips 3 form four series conducting loops respectively in the first, second, third and fourth quadrants 1111, 1112, 1113, 1114. Each of the series conducting loops includes four LED chips 3. That is, sixteen LED chips 3 are disposed in the substantially circular die bonding area 111 in horizontal arrangement, and are arranged in the shape of a cross. To more specific, the LED chips 3 in each of the quadrants 1111, 1112, 1113, 1114 are aligned along the imaginary centerlines LX, LY in an L-shaped configuration. Such arrangement enables the conductive wires 5 connecting the LED chips 3 to have substantially the same length, and prevent the problem of wires breaking as a result of excessive wire length. The LED chips 3 in one of the quadrants are arranged mirror-symmetrically to those in an adjacent one of the quadrants.

In this arrangement, when a diameter of the substantially circular die bonding area 111 is 5.2 mm, the area of the substantially circular die bonding area 111 is 21.2372 mm$^2$. The LED chips 3 occupy 38.9% of the area of the substantially circular die bonding area 111.

Luminescence and CIE (International Commission on Illumination) data of the seventh type (as shown in FIG. 19) and the first type (as shown in FIG. 2) of arrangement of the LED chips 3 are presented in Table 1. As shown in Table 1, the first type of arrangement improves luminescence by 5% as compared to the seventh type of arrangement. In other words, by changing the arrangement of the LED chips 3, the LED chips 3 may be evenly disposed on the substantially circular die bonding area 111 so that light blockage by the LED chips 3 is avoided, thereby enhancing the light extraction efficiency of the light emitting device 100.

TABLE 1

|  | lm (%) | lm | CIE-X | CIE-Y |
| --- | --- | --- | --- | --- |
| First type of arrangement as shown in FIG. 2 | 105 | 980.17 | 0.3913 | 0.4012 |
| Seventh type of arrangement as shown in FIG. 19 | 100 | 930.46 | 0.3911 | 0.4044 |

With deposition of the Zener diodes 4 on the polygonal extension areas 112 of the central region, the Zener diodes 4 would not block the light emitted from the LED chips 3, thereby enhancing the light extraction efficiency of the light emitting device 100. In addition, reduction of the area of the upper metal layer 21 would increase the bonding area between the encapsulant 6 and the top surface 11 of the substrate 1, thereby increasing the bonding strength between the encapsulant 6 and the substrate 1. Moreover, with the receiving space 80 defined by the surrounding wall 8 and the top surface 11 of the substrate 1, the luminescent layer 9 could be formed in the receiving space 80 by a glue dispensing technique, and less phosphor powder for the luminescent layer 9 is required in this embodiment, thereby reducing manufacture costs. Furthermore, the substrate 1 made of the mixture of aluminum oxide and the inorganic component has superior light reflectivity. Therefore, light irradiated to the substrate 1 from the LED chips 3 may be reflected outwardly more effectively, thereby enhancing the light extraction efficiency of the light emitting device 100. Finally, formation of the upper metal layer 21 and the lower metal layer 22 by the screen printing technique would also reduce manufacturing costs.

While the present invention has been described in connection with what are considered the exemplary embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A light emitting device, comprising:
    a substrate that has opposite top and bottom surfaces, said top surface including a central region that is bounded by an imaginary boundary with a profile substantially conforming to an outline of a circle in combination with a polygon stacked on said circle, said central region having a substantially circular die bonding area that corresponds to said circle, and at least one polygonal extension area that is formed outside said circular die bonding area by an intersection of said circle with a corner part of said polygon;
    an upper metal layer that includes a conducting pad assembly including at least one first conducting pad and at least one second conducting pad, said first and second conducting pads being disposed on said top surface of said substrate and surrounding said central region;
    a lower metal layer that includes a soldering pad assembly including at least one first soldering pad and at least one second soldering pad, said first and second soldering pads being disposed on said bottom surface of said substrate and being electrically connected to said first and second conducting pads, respectively;
    a plurality of LED chips that are disposed on said substantially circular die bonding area of said central region;
    at least one Zener diode that is disposed on a non-electrically conducting portion of said at least one polygonal extension area of said central region, between said circular die bonding area and one of said first and second conducting pads;
    a plurality of conductive wires that electrically interconnect said LED chips, said at least one Zener diode, said at least one first conducting pad and said at least one second conducting pad to form at least one conducting loop; and
    a light-transmissible encapsulant disposed on said top surface of said substrate and that covers said LED chips wherein said at least one polygonal extension area of said central region is located between said circular die bonding area and one of said first and second conducting pads.

2. The light emitting device as claimed in claim 1, wherein said polygon of said outline is a rectangle.

3. The light emitting device as claimed in claim 2, wherein each of said at least one first conducting pad and said at least one second conducting pad is arc shaped and is disposed along said circle.

4. The light emitting device as claimed in claim 2, wherein each of said at least one first conducting pad and said at least one second conducting pad is linear shaped and is disposed along said rectangle.

5. The light emitting device as claimed in claim 1, wherein said conducting pad assembly includes four of said first conducting pads and four of said second conducting pads, two of said first conducting pads being arc shaped pads and the other two of said first conducting pads being linear shaped pads, two of said second conducting pads being arc shaped pads and the other two of said second conducting pads being linear shaped pads, said two arc shaped pads of said first conducting pads being disposed oppositely of said two arc shaped pads of said second conducting pads and surrounding said substantially circular die bonding area in combination with said two arc shaped pads of said second conducting pads, said two linear shaped pads of said first conducting pads and said two linear shaped pads of said second conducting pads being correspondingly disposed along two opposite sides of said polygon.

6. The light emitting device as claimed in claim 5, wherein each of said two arc shaped pads of said first conducting pads and said two arc shaped pads of said second conducting pads has a main portion and a protruded portion protruding from said main portion oppositely of said central region, said main portion being an arc-shaped strip aligned along said substantially circular die bonding area, said protruded portion having a substantial semi-circular shape.

7. The light emitting device as claimed in claim 6, wherein said substrate further includes four first inner conductors and four second inner conductors, said four first inner conductors being respectively formed at said protruded portions of said two arc shaped pads of said first conducting pads and said two linear shaped pads of said first conducting pads, and electrically connecting said first conducting pads to said at least one first soldering pad, said four second inner conductors being respectively formed at said protruded portions of said two arc shaped pads of said second conducting pads and said two linear shaped pads of said second conducting pads, and electrically connecting said second conducting pads to said at least one second soldering pad.

8. The light emitting device as claimed in claim 6, wherein said soldering pad assembly includes four of said first soldering pads and four of said second soldering pads, said substrate further including four first inner conductors and four second inner conductors, said four first inner conductors being respectively formed at said protruded portions of said two arc shaped pads of said first conducting pads and said two linear shaped pads of said first conducting pads, and electrically connecting said first conducting pads to said first soldering pads, respectively, said four second inner conductors being respectively formed at said protruded portions of said two arc shaped pads of said second conducting pads and said two linear shaped pads of said second conducting pads, and electrically connecting said second conducting pads to said second soldering pads, respectively.

9. The light emitting device as claimed in claim 1, wherein said upper metal layer further includes a die bonding pad that covers said substantially circular die bonding area and said at least one polygonal extension area, and that carries said LED chips and said at least one Zener diode.

10. The light emitting device as claimed in claim 1, wherein said LED chips are directly disposed on said substantially circular die bonding area, said at least one Zener diode being directly dispose on said at least one polygonal extension area.

11. The light emitting device as claimed in claim 1, wherein a shortest distance between two adjacent ones of said LED chips ranges from 0.15 mm to 0.6 mm.

12. The light emitting device as claimed in claim 1, wherein a shortest distance between two adjacent ones of said conductive wires ranges from 0.3 mm to 1.3 mm.

13. The light emitting device as claimed in claim 1, further comprising a surrounding wall and a luminescent layer that are disposed on said top surface of said substrate, said surrounding wall being disposed on said at least one first conducting pad and said at least one second conducting pad, and surrounding said central region, said surrounding wall cooperating with said top surface of said substrate to define a receiving space, said luminescent layer being disposed in said receiving space and covering said LED chips.

14. The light emitting device as claimed in claim 13, wherein each of said at least one first conducting pad and said at least one second conducting pad has a protruded portion, said surrounding wall covering a part of said at least one first conducting pad and a part of said at least one second conducting pad, said protruded portion of each of said at least one first conducting pad and said at least one second conducting pad being protruded outside said surrounding wall.

15. The light emitting device as claimed in claim 13, wherein a part of said at least one Zener diode is covered by said surrounding wall.

16. The light emitting device as claimed in claim 1, wherein said substantially circular die bonding area is divided into first, second, third and fourth quadrants by two imaginary centerlines, said first, second, third and fourth quadrants being arranged in such order in a counterclockwise direction, said LED chips in one of said quadrants being arranged mirror-symmetrically to that in an adjacent one of said quadrants.

17. The light emitting device as claimed in claim 16, wherein an arrangement of said LED chips in said first quadrant and said second quadrant is mirror-symmetrical to that of said LED chip in said third quadrant and said fourth quadrant, or an arrangement of said LED chips in said first quadrant and said fourth quadrant is mirror-symmetrical to that of said LED chips in said second quadrant and said third quadrant.

18. The light emitting device as claimed in claim 16, wherein an arrangement of said LED chips in said first quadrant and second quadrant is an omega-shaped configuration, said LED chips in said first quadrant and second quadrant are mirror-symmetrical to that of said LED chips in said third quadrant and said forth quadrant.

19. The light emitting device as claimed in claim 16, wherein said LED chips in each of said quadrants are arranged into an L-shaped configuration and said LED chips in said circular die bonding area are arranged in a shape of a cross.

20. The light emitting device as claimed in claim 1, said substrate is made of a mixture of aluminum oxide (Al2O3) and a desired inorganic component selected from the group consisting of zirconium (Zr), calcium (Ca), barium (Ba), magnesium (Mg), oxide thereof, aluminate thereof, and aluminosilicate thereof.

* * * * *